(12) United States Patent
Li et al.

(10) Patent No.: US 12,125,930 B2
(45) Date of Patent: Oct. 22, 2024

(54) TANDEM SOLAR CELL

(71) Applicant: LONGI GREEN ENERGY TECHNOLOGY CO., LTD., Shaanxi (CN)

(72) Inventors: Zifeng Li, Shaanxi (CN); Zhao Wu, Shaanxi (CN); Chen Xu, Shaanxi (CN)

(73) Assignee: LONGI GREEN ENERGY TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/024,611

(22) PCT Filed: Sep. 16, 2021

(86) PCT No.: PCT/CN2021/118782
§ 371 (c)(1),
(2) Date: Mar. 3, 2023

(87) PCT Pub. No.: WO2022/057860
PCT Pub. Date: Mar. 24, 2022

(65) Prior Publication Data
US 2023/0327037 A1 Oct. 12, 2023

(30) Foreign Application Priority Data
Sep. 18, 2020 (CN) .......................... 202010988035.6

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02164* (2013.01); *H01L 31/022441* (2013.01);
(Continued)

(58) Field of Classification Search
None
See application file for complete search history.

(56) References Cited

U.S. PATENT DOCUMENTS

| 9,935,230 B1* | 4/2018 | Bedell ............. H01L 31/022433 |
| 2007/0246094 A1* | 10/2007 | Brabec ................... B82Y 10/00 136/244 |

(Continued)

FOREIGN PATENT DOCUMENTS

| CN | 103069580 | 4/2013 |
| CN | 105449027 | 3/2016 |

(Continued)

OTHER PUBLICATIONS

Chinese Office Action for Application No. 202010988035.6, mailed Nov. 3, 2021 (12 pages).

(Continued)

*Primary Examiner* — Eli S Mekhlin
(74) *Attorney, Agent, or Firm* — NIXON PEABODY LLP; Jeffrey L. Costellia

(57) ABSTRACT

The laminated A tandem solar cell includes a bottom cell and a top cell located on the bottom cell, wherein the bottom cell includes a first doping portion and a second doping portion, the first doping portion and the second doping portion form at least one PN junction, majority carriers in the first doping portion are a first type of carrier, and majority carriers in the second doping portion are a second type of carrier; the bottom cell is provided with a first electrode hole and a second electrode hole which penetrate the bottom cell, a first electrode is formed in the first electrode hole, and a second electrode is formed in the second electrode hole; the first electrode is in contact with the first doping portion; and the second electrode is in contact with the second doping portion.

11 Claims, 18 Drawing Sheets

(51) Int. Cl.
*H01L 31/0224* (2006.01)
*H01L 31/0288* (2006.01)
*H01L 31/0352* (2006.01)
*H01L 31/18* (2006.01)

(52) U.S. Cl.
CPC .. *H01L 31/0288* (2013.01); *H01L 31/035272* (2013.01); *H01L 31/1868* (2013.01); *H01L 31/02168* (2013.01); *H01L 31/035218* (2013.01)

(56) References Cited

U.S. PATENT DOCUMENTS

2009/0127555 A1* 5/2009 Yamazaki ......... H01L 31/03685
438/73
2010/0083997 A1 4/2010 Hovel
2010/0206366 A1* 8/2010 English ........... H01L 31/022425
136/255
2016/0307704 A1 10/2016 Hillhouse et al.

FOREIGN PATENT DOCUMENTS

| CN | 107564989 | 1/2018 |
| CN | 108604608 | 9/2018 |
| CN | 109888034 | 6/2019 |
| CN | 111435691 | 7/2020 |
| CN | 111656535 | 9/2020 |
| CN | 112086536 | 12/2020 |
| FR | 3041475 | 3/2017 |
| WO | WO-2012/160765 | 11/2012 |
| WO | WO-2019/143776 | 7/2019 |

OTHER PUBLICATIONS

International Search Report for Application No. PCT/CN2021/118782, mailed Dec. 22, 2021 (4 pages).

* cited by examiner

TANDEM SOLAR CELL

CROSS-REFERENCES TO RELATED APPLICATIONS

This application claims priority to the Chinese patent application No. 202010988035.6 entitled "TANDEM SOLAR CELL" filed in China National Intellectual Property Administration on Sep. 18, 2020, which is incorporated herein by reference in their entirety.

TECHNICAL FIELD

The disclosure relates to the technical field of photovoltaics, in particular to a tandem solar cell.

BACKGROUND

A tandem solar cell is a cell structure composed of a top cell and a bottom cell. The top cell is made of a light-transmitting material with a wide band gap. The bottom cell is made of a light-transmitting material with a narrow band gap. On this basis, sunlight with short wavelengths may be utilized by the top cell located above, and sunlight with long wavelengths may be transmitted through the top cell into the bottom cell and utilized by the bottom cell. Therefore, the tandem solar cell may utilize sunlight with a wide range of wavelengths, and have a high light energy utilization.

In related art, an interdigitated back contact (IBC) cell may be used as the bottom cell to absorb carriers generated by the top cell, and carriers may be extracted from an emitter and a back field at a bottom of the IBC cell. However, the carriers generated by the top cell may be recombined in the IBC cell to a certain extent, which leads to a low efficiency of the tandem cell. Taking an IBC cell as the bottom cell and a perovskite cell as the top cell as an example, an operation process of an existing tandem solar cell is briefly described.

FIG. 1 illustrates a schematic diagram of a structure of a tandem solar cell in related art. As shown in FIG. 1, a hole transport layer 102 included in the top cell 101 of the tandem solar cell may be located above an absorption layer 103, and an electron transport layer 104 may be located below the absorption layer 103. The absorption layer 103 included in the top cell 101 may generate electron-hole pairs after absorbing sunlight. Holes generated in the top cell 101 may be conducted to a positive electrode 106 via the hole transport layer 102 above the absorption layer 103, and thus collected by the positive electrode 106. In addition, electrons generated in the top cell 101 may be conducted to the bottom cell 100 via the electron transport layer 104 below the absorption layer 103, and be collected by a negative electrode 107 located at a bottom surface of the bottom cell through the bottom cell 100. In the above process, a substrate 105 included in the bottom cell 100 also absorbs sunlight to generate electron-hole pairs. On this basis, when electrons generated in the top cell 101 pass through the bottom cell 100, bulk recombination, interface recombination or defect recombination may easily occur between the electrons with holes generated in the bottom cell 100, resulting in reduction in numbers of holes and electrons that may be collected by the positive electrode 106 and the negative electrode 107 on a bottom surface of the bottom cell, respectively, which greatly reduces photoelectric conversion efficiency of the tandem solar cell.

SUMMARY

An object of the present disclosure is to provide a tandem solar cell, so as to improve utilization of light energy of the tandem solar cell, thereby improving photoelectric conversion efficiency of the tandem solar cell.

A tandem solar cell is provided in the present disclosure. The tandem solar cell includes a bottom cell and a top cell located above the bottom cell. The bottom cell includes a first doped part and a second doped part. The first doped part and the second doped part form at least one PN junction. A majority carrier of the first doped part is a first-type carrier. A majority carrier of the second doped part is a second-type carrier.

The bottom cell has a first electrode hole and a second electrode hole penetrating through the bottom cell. A first electrode is at least partially arranged in the first electrode hole, and a second electrode is at least partially arranged in the second electrode hole.

The first electrode is in contact with the first doped part and is configured for exporting first-type carriers of the bottom cell and the top cell. The second electrode is in contact with the second doped part and is configured for exporting second-type carriers of the bottom cell and the top cell.

With the above technical solution, in the tandem solar cell according to the present disclosure, the first doped part and the second doped part of the bottom cell may form at least one PN junction. Further, the first electrode and the second electrode penetrating through the bottom cell are formed inside the bottom cell, so that during an operation process of the tandem solar cell, the first electrode may export the first-type carriers generated in the top cell and the bottom cell, and the second electrode may export the second-type carriers generated in the top cell and the bottom cell. In other words, first-type carriers and second-type carriers generated after a semiconductor layer of the top cell absorbs sunlight may both move in the top cell in a direction close to a backlight surface of the top cell and be collected by the first electrode and the second electrode penetrating through the bottom cell, respectively. Based on above reasons, the tandem solar cell according to the present disclosure may reduce probability of recombination of the first-type carriers or the second-type carriers generated in the top cell with the second-type carriers or the first-type carriers generated in the bottom cell when passing through the bottom cell, thereby enhancing a photovoltaic electric field generated by the bottom cell under illumination, improving utilization of light energy of the tandem solar cell, and finally improving photoelectric conversion efficiency of the tandem solar cell.

In a possible implementation, each of the at least one PN junction includes a first junction region perpendicular to the top cell.

With the above technical solution, when the PN junction formed in the bottom cell includes the first junction region perpendicular to the top cell, length extension directions of the first doped part and the second doped part forming the PN junction is perpendicular to a bottom surface of the top cell. In this case, when axial directions of the first electrode hole and the second electrode hole penetrating the bottom cell are also perpendicular to the bottom surface of the top cell, the length extension directions of the first electrode and the second electrode are the same as those of the first doped part and the second doped part, respectively, so that contact areas of the first electrode and the second electrode respectively with the first doped part and the second doped part are large. At this time, first-type carriers generated by the first doped part are easily exported by the first electrode under action of a built-in electric field, which reduces recombination probability of the first-type carriers in the bottom cell. Meanwhile, second-type carriers generated by the second doped part are easily exported by the second electrode under action of the built-in electric field, which reduces recombination probability of the second-type carriers in the bottom cell, thus improving the photoelectric conversion efficiency of the tandem solar cell.

In a possible implementation, each of the at least one PN junction includes a second junction region parallel to the bottom surface of the top cell.

With the above technical solution, when the PN junction formed in the bottom cell includes the second junction region parallel to the bottom surface of the top cell, the first doped part and the second doped part included in the bottom cell are in a tandem structure stacked together along a thickness direction of the bottom cell. Therefore, when the bottom cell is manufactured, the first doped part and the second doped part may be manufactured by a mature deposition process, which reduces manufacturing difficulty of the tandem solar cell. Moreover, when the PN junction formed in the bottom cell includes a second junction region parallel to the bottom surface of the top cell, a PN junction interface formed in the bottom cell is parallel to a light receiving surface of the bottom cell, and light rays may be uniformly irradiated on the whole PN junction interface after being transmitted into the bottom cell from the light receiving surface of the bottom cell, so that balanced numbers of first-type carriers and second-type carriers are generated in respective areas of the bottom cell, and probability of recombination caused by uneven distribution of two types of carriers when the first-type carriers are moved toward the first doped part and the second-type carriers are move toward the second doped part may be reduced, and thus a larger current may be formed when an external circuit is connected, and operation performance of the tandem solar cell may be improved.

In a possible implementation, the PN junction includes a first junction region perpendicular to a bottom surface of the top cell, and the first electrode may be made of a metal material and/or a first-type carrier conducting material.

In practical applications, under the condition that the PN junction formed in the bottom cell only includes the first junction region being perpendicular to the top cell, a part of the first electrode located in the bottom cell may be in contact with the first doped part included in the bottom cell, but not with the second doped part. At this time, regardless of whether the first electrode is made of the metal material or the first-type carrier conducting material, under the action of the built-in electric field of the PN junction formed in the bottom cell, the first electrode only conducts the first-type carrier generated in the bottom cell and the top cell, but does not conduct the second-type carrier, thus expanding a material selection range of the first electrode.

In a possible implementation, the PN junction only includes the first junction region perpendicular to the bottom surface of the top cell, and the second electrode may be made of a metal material and/or a second-type carrier conducting material.

In practical applications, under the condition that the PN junction formed in the bottom cell only includes the first junction region being perpendicular to the top cell, a part of the second electrode located in the bottom cell may be in contact with the second doped part included in the bottom cell, but not with the first doped part. At this time, regardless of whether the second electrode is made of the metal material or the second-type carrier conducting material, under the action of the built-in electric field of the PN junction formed in the bottom cell, the second electrode only conducts the second-type carrier generated in the bottom cell and the top cell, but does not conduct the first-type carrier, thus expanding a material selection range of the second electrode.

In a possible implementation, the first electrode includes a first conducting part and a first metal part distributed in a direction away from the top cell. At least part of the first conducting part is located in a corresponding first electrode hole. The first conducting part may be made of the first-type carrier conducting material. The second electrode includes a second conducting part and a second metal part distributed in the direction away from the top cell. At least part of the second conducting part is located in a corresponding second electrode hole. The second conducting part is made of the second-type carrier conducting material.

With the above technical solution, each first electrode includes the first conducting part at least partially located in the corresponding first electrode hole and made of the first-type carrier conducting material, so that each first electrode has good carrier-conduction selectivity. At this time, each first electrode may only transmit the first-type carriers, preventing the PN junction from being short-circuited. Furthermore, since the metal material has better conductive characteristics than the first-type carrier conducting material, when the first electrode further includes the first metal part located on a surface of the first conducting part away from the top cell, conductivity of the first electrode may be improved. Similarly, because each second electrode includes the second conducting part and the second metal part located on a surface of the second conducting part away from the top cell, each second electrode has good carrier-conduction selectivity and good conductivity.

In a possible implementation, a position of the first metal part relative to the first electrode hole is also different due to different contact between the first electrode and the second doped part. Similarly, a position of the second metal part relative to the second electrode hole is different due to different contact between the second electrode and the first doped part.

For example, at least part of the first metal part is located in a corresponding first electrode hole. At least part of the second metal part is located in a corresponding second electrode hole. At this time, in a case where it is at least ensured that a part of the first electrode contacting with the second doped part is the first conducting part, a length of the first metal part in the first electrode hole may be appropriately increased, so as to improve a conduction rate of the first-type carriers in the first electrode. Similarly, in a case where it is at least ensured that a part of the second electrode contacting with the first doped part is the second conducting part, a length of the second metal part in the second electrode hole may be appropriately increased, so as to improve a conduction rate of the second-type carriers in the second electrode, thus improving the photoelectric conversion efficiency of the tandem solar cell.

For example, the first metal part is located outside the first electrode hole. The second metal part is located outside the second electrode hole. At this time, the first conducting part which only transmits the first-type carriers at least fills full the first electrode hole, preventing the first metal part from contacting the second doped part in the first electrode hole. In addition, the second conducting part that only transmits the second-type carriers at least fills full the second electrode hole, preventing the second metal part from contacting the first doped part in the second electrode hole, thus avoiding short circuit of the PN junction and improving operation stability of the tandem solar cell.

In a possible implementation, the PN junction includes a second junction region parallel to a bottom surface of the top cell, and a part of the first electrode contacting with the second doped part is set as a third conducting part. The third conducting part is made of the first-type carrier conducting material. A part of the second electrode contacting with the first doped part is set as a fourth conducting part. The fourth conducting part is made of the second-type carrier conducting material.

With the above technical solution, when the PN junction only includes the second junction region parallel to the bottom surface of the top cell, both the first electrode and the second electrode penetrating through the bottom cell are in contact with the first doped part and the second doped part. On this basis, when the part of the first electrode contacting with the second doped part is set as the third conducting part made of the first-type carrier conducting material, and the part of the second electrode contacting with the first doped part is set as the fourth conducting part made of the second-type carrier conducting material, the short circuit of the PN junction formed by the first doped part and the second doped part may be prevented. When the PN junction includes both the first junction region and the second junction region, the first electrode is in contact with the first doped part and the second doped part, while the second electrode is only in contact with the second doped part. Therefore, the part of the first electrode contacting with the second doped part is set as the third conducting part made of the first-type carrier conducting material, the short circuit of the PN junction formed by the first doped part and the second doped part may be prevented.

In a possible implementation, the bottom cell includes a first junction region perpendicular to the top cell, and a side away from the bottom surface of the top cell is not provided with a second junction region parallel to the bottom surface of the top cell. The first electrode has a first outer edge part extending out of a corresponding first electrode hole on a side of the first electrode away from the top cell. The tandem solar cell further includes a first electrode auxiliary layer located between the first outer edge part and the second doped part. And/or, the second electrode has a second outer edge part extending out of a corresponding second electrode hole on a side of the second electrode away from the top cell. The tandem solar cell also includes a second electrode auxiliary layer located between the second outer edge part and the first doped part. The first electrode auxiliary layer and the second electrode auxiliary layer at least have an electrical isolation function.

With the above technical solution, the first electrode is an electrode configured for exporting the first-type carriers of the top cell and the bottom cell. The majority carrier of the second doped part is the second-type carrier. When the first electrode has the first outer edge part extending out of the corresponding first electrode hole on the side of the first electrode away from the top cell, the first electrode auxiliary layer may separate the first outer edge part from the second doped part. Specifically, when the first electrode auxiliary layer has the electrical isolation function, the existence of the first electrode auxiliary layer may prevent the first outer edge part from being electrically connected with the second doped part, thus preventing the PN junction from being short-circuited. Similarly, beneficial effects of the second electrode auxiliary layer may be referred to those of the first electrode auxiliary layer, which will not be repeatedly described here again.

In a possible implementation, the first electrode auxiliary layer extends into the first electrode hole. A part of the first electrode auxiliary layer extending into the first electrode hole is formed between the first electrode and the first doped part. The second electrode auxiliary layer extends into the second electrode hole. A part of the second electrode auxiliary layer extending into the second electrode hole is formed between the second electrode and the second doped part. A part of the first electrode auxiliary layer between the first electrode and the first doped part and a part of the second electrode auxiliary layer between the second electrode and the second doped part have at least one of a lattice matching function, an energy-band matching function and a passivation function.

With the above technical solution, when the first electrode auxiliary layer has the lattice matching function, the existence of the first electrode auxiliary layer may reduce lattice mismatch between the first electrode and the first doped part, preventing a defect recombination center from being formed between the first outer edge part and the second doped part, and further reducing probability of recombination of the first-type carriers with the second-type carriers at a contact between the first electrode and the first doped part. When the first electrode auxiliary layer has the energy-band matching function, the first electrode auxiliary layer may also reduce an energy-level difference between the first electrode and the first doped part, improving a conduction rate of the first-type carrier from the first doped part into the first electrode, increasing utilization of light energy of the bottom cell, and finally improving the photoelectric conversion efficiency of the tandem solar cell. When the first electrode auxiliary layer has the passivation function, the first electrode auxiliary layer may reduce a surface state density of the first electrode and the first doped part, and reduce a rate of defect recombination of the first-type carriers generated in the bottom cell with the second-type carriers at a contact position between the first electrode and the first doped part. Similarly, beneficial effects of the second electrode auxiliary layer may be referred to those of the first electrode auxiliary layer, which will not be repeatedly described here again.

In a possible implementation, when the tandem solar cell includes the first outer edge part and the second outer edge part, the first outer edge part and the second outer edge part are made of metal materials. The first electrode auxiliary layer and/or the second electrode auxiliary layer are used for avoiding contact between the first outer edge part and the second outer edge part.

With the above technical solution, when materials contained in both the first outer edge part and the second outer edge part are metal materials, the first outer edge part and the second outer edge part both have ability to conduct the first-type carriers and the second-type carriers. On this basis, when the first electrode auxiliary layer further includes a part between the first outer edge part and the second outer edge part, and the first electrode auxiliary layer has an insulation property, the existence of the first electrode auxiliary layer may prevent the first outer edge part from being in contact with the second outer edge part, preventing two opposite electrodes from being electrically connected with each other, and improving the operation stability of the tandem solar cell. When a structure between the first outer edge part and the second outer edge part is the second electrode auxiliary layer, and the second electrode auxiliary layer has an insulation property, the existence of the second electrode auxiliary layer may also prevent the first outer edge part from being in contact with the second outer edge part, preventing the two opposite electrodes from being electrically connected with each other.

In a possible implementation, the tandem solar cell further includes at least two auxiliary electrodes. At least one of the two auxiliary electrodes is covered on a surface of a corresponding first electrode facing the top cell. At least one of the two auxiliary electrodes is covered on a surface of a corresponding second electrode facing the top cell. An auxiliary electrode corresponding to each first electrode may be made of a metal material and/or a first-type carrier conducting material; and/or, an auxiliary electrode corresponding to each second electrode is made of a metal material and/or a second-type carrier conducting material.

With the above technical solution, the first electrode and the second electrode are respectively formed in the first electrode hole and the second electrode hole penetrating through the bottom cell, so effective contact areas of the first electrode and the second electrode with the top cell are respectively affected by radial cross-sectional areas of the first electrode hole and the second electrode hole. When at least one auxiliary electrode is respectively covered on surfaces of the first electrode and the second electrode facing the top cell, the existence of the auxiliary electrode may increase the effective contact areas of the first electrode and the second electrode with the top cell. In addition, conductivity of the metal material, the first-type carrier conducting material and the second-type carrier conducting material to carriers is much higher than that of a semiconductor material, so the existence of the auxiliary electrode may enhance ability of the first electrode and the second electrode to collect corresponding types of carriers, thus improving the photoelectric conversion efficiency of the tandem solar cell.

In a possible implementation, each auxiliary electrode includes a plurality of main electrodes and at least one fine grid line. The main electrodes are electrically connected with each other by a fine grid line. The main electrode is located at a part of the corresponding first electrode or second electrode contacting with the top cell.

With the above technical solution, the fine grid line included in each auxiliary electrode may assist in collecting the first-type carriers or the second-type carriers. Furthermore, a plurality of main electrodes included in each auxiliary electrode is covered at a part of a corresponding first electrode or second electrode contacting with the top cell, thus assisting the first electrode or second electrode to collect the first-type carrier or the second-type carrier in the top cell, reducing probability of recombination of the two types of carriers in the top cell at an interface between the top cell and the bottom cell, and improving utilization of light energy of the tandem solar cell.

In a possible implementation, the tandem solar cell further includes a first auxiliary layer. The first auxiliary layer is formed on a surface of the bottom cell close to the top cell. Longitudinal conductive ability of the first auxiliary layer is greater than lateral conductive ability thereof. A material contained in the first auxiliary layer has at least one of a passivation function, an optical adjustment function, a lattice matching function and an energy-band matching function.

With the above technical solution, the first auxiliary layer is arranged between the bottom cell and the top cell to improve operation performance of the tandem solar cell. Specifically, when the first auxiliary layer has the passivation function and/or the lattice matching function, the first auxiliary layer may reduce recombination probability of the two types of carriers at the interface between the top cell and the bottom cell. When the first auxiliary layer has the optical adjustment function, the first auxiliary layer may have good light trapping effect, so that more light may be transmitted into the bottom cell. When the first auxiliary layer has the energy-band matching function, the first auxiliary layer may reduce the energy level difference between the top cell and the first electrode as well as the second electrode, respectively, and improve a conduction rate of the two types of carriers from the top cell to the first electrode or the second electrode, so as to facilitate the first electrode and the second electrode to collect corresponding carriers. In addition, since the first auxiliary layer is located between the bottom cell and the top cell, and the first electrode and the second electrode penetrate through the bottom cell, surfaces of the first electrode and the second electrode close to the top cell may be in contact with the first auxiliary layer. On this basis, if the first auxiliary layer has conductive ability and the longitudinal conductive ability of the first auxiliary layer is greater than the lateral conductive ability, it means that a longitudinal conduction rate of the first-type carrier and the second-type carrier in the first auxiliary layer is greater than a lateral conduction rate thereof, which may prevent the first electrode and the second electrode from being short-circuited through electrical connection of the first auxiliary layer and improve the operation stability of the tandem solar cell.

In a possible implementation, at least one first electrode and/or at least one second electrode penetrates through the first auxiliary layer. At this time, the first electrode and/or the second electrode penetrating through the first auxiliary layer may be in directly contact with the backlight surface of the top cell, which facilitates the first electrode and/or the second electrode to collect the corresponding carriers in the top cell and improves the operation performance of the tandem solar cell.

BRIEF DESCRIPTION OF THE DRAWINGS

The drawings illustrated here are intended to provide further understanding of the present disclosure and form a part of it. Illustrative embodiments of the present disclosure and their descriptions are used to explain the present disclosure, but do not constitute undue restrictions on the present disclosure. In the drawings.

DETAILED DESCRIPTION OF THE EMBODIMENTS

Figure 1:
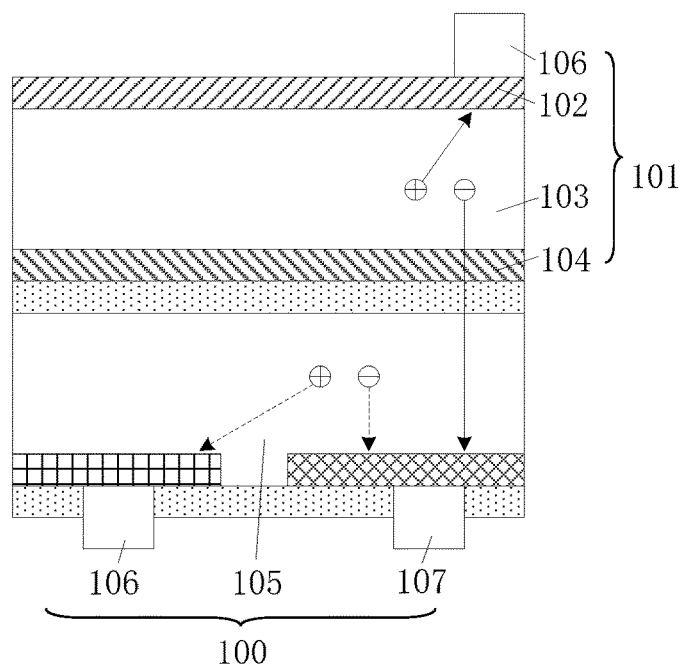
FIG. 1 is a schematic diagram of a structure of a tandem solar cell in related art.

Hereinafter, embodiments of the present disclosure will be described with reference to the drawings. However, it should be understood that these descriptions are only exemplary, and are not intended to limit the scope of the present disclosure. In addition, in following description, descriptions of well-known structures and technologies are omitted to avoid unnecessarily obscuring concepts of the present disclosure.

Various structural schematic diagrams according to embodiments of the present disclosure are shown in the drawings. These figures are not drawn to scale, in which some details are exaggerated and may be omitted for sake of clarity. Shapes of various regions and layers shown in the figures, as well as their relative sizes and positional relationships, are only exemplary. In practice, there may be deviations due to manufacturing tolerances or technical limitations, and those skilled in the art may additionally design regions/layers with different shapes, sizes and relative positions according to actual needs.

In context of the present disclosure, when a layer/element is referred to as being "on" another layer/element, the layer/element may be directly on the other layer/element, or there may be an intermediate layer/element between them. In addition, if one layer/element is "above" another layer/element in one orientation, the layer/element may be "below" the other layer/element when the orientation is reversed.

In addition, terms "first" and "second" are only used for descriptive purposes, and may not be understood as indicating or implying relative importance. Therefore, features defined with "first" or "second" may include one or more of these features explicitly or implicitly. In the description of the present disclosure, "multiple" means two or more, unless otherwise specifically defined. Meaning of "several" is one or more than one, unless otherwise specifically defined.

A tandem solar cell is a cell structure composed of a top cell and a bottom cell. The top cell is made of a light-transmitting material with a wide band gap. The bottom cell is made of a light-transmitting material with a narrow band gap. On this basis, sunlight with short wavelengths may be utilized by the top cell located above, and sunlight with long wavelengths may be transmitted through the top cell into the bottom cell and utilized by the bottom cell. Therefore, the tandem solar cell may utilize sunlight with a wide range of wavelengths and have a high light energy utilization.

To solve technical problems encountered in related art, a tandem solar cell is provided in an embodiment of the present disclosure. As shown in FIG. 2A to FIG. 10, the tandem solar cell includes a bottom cell 200 and a top cell 201 located above the bottom cell 200.

Specifically, as shown in FIG. 2A to FIG. 10, a band gap width of the material of the top cell 201 is larger than that of the bottom cell 200. The top cell 201 may be any back-contact solar cell, that is, both a positive electrode and a negative electrode of the top cell 201 are located on the backlight surface of the top cell 201. For example, the top cell 201 may be an IBC cell or a heterojunction cell with both a positive electrode and a negative electrode on one side. As another example, an absorption layer included in the top cell 201 is made of an exciton material such as a perovskite material, an organic material or a quantum-dot material, and a first-type carrier transport layer and a second-type carrier transport layer included in the top cell 201 are arranged on a backlight surface of the absorption layer, so that both the first-type carrier and the second-type carrier in the top cell 201 may be moved in a direction toward the backlight surface of the top cell 201.

As shown in FIG. 2A to FIG. 10, the bottom cell 200 includes a first doped part 202 and a second doped part 203.

The first doped part 202 and the second doped part 203 form at least one PN junction. A majority carrier of the first doped part 202 is a first-type carrier. A majority carrier of the second doped part 203 is a second-type carrier. The bottom cell 200 has a first electrode hole and a second electrode hole penetrating through the bottom cell 200. The first electrode 204 is at least partially disposed in the first electrode hole. The second electrode 205 is at least partially disposed in the second electrode hole. The first electrode 204 is in contact with the first doped part 202 and is configured for exporting first-type carriers of the bottom cell 200 and the top cell 201. The second electrode 205 is in contact with the second doped part 203 and is configured for exporting second-type carriers of the bottom cell 200 and the top cell 201.

Illustratively, as shown in FIG. 2A to FIG. 10, a doping type of impurities in the first doped part 202 included in the bottom cell 200 is opposite to that of impurities in the second doped part 203 included in the bottom cell 200.

For example, as shown in FIG. 2A to FIG. 10, the first doped part 202 may be a semiconductor material part doped with N-type impurities (such as phosphorus). At this time, a majority carrier of the first doped part 202 is an electron. The second doped part 203 may be a semiconductor material part doped with P-type impurities (such as boron). At this time, a majority carrier of the second doped part 203 is a hole. Correspondingly, at this time, the first-type carrier is an electron, and the first electrode 204 is configured to collect electrons, and the first electrode 204 is a negative electrode. The second-type carrier is a hole, and the second electrode 205 is configured to collect holes, and the second electrode 205 is a positive electrode.

As another example, as shown in FIG. 2A to FIG. 10, the first doped part 202 may be a semiconductor material part doped with P-type impurities, and at this time the majority carrier of the first doped part 202 is the hole. The second doped part 203 may be a semiconductor material part doped with an N-type material, and the majority carrier of the second doped part 203 is the electron. Correspondingly, at this time, the first-type carrier is the hole, and the first electrode 204 is configured to collect holes, and the first electrode 204 is the positive electrode. The second-type carrier is the electron, the second electrode 205 is configured to collect electrons, and the second electrode 205 is a negative electrode. The semiconductor material part may be made of a semiconductor material such as polysilicon.

As shown in FIG. 2A to FIG. 10, a specific structure of the PN junction formed in the bottom cell 200 is determined by specific structures of the first doped part 202 and the second doped part 203 and their relative position relationship, and thus the first doped part 202 and the second doped part 203 may be set according to the specific structure of the PN junction. Certainly, it may also be set according to actual application scenarios, as long as it may be applied to the tandem solar cell according to the embodiments of the present disclosure. For the first electrode 204 and the second electrode 205, the specific structures and materials of the first electrode 204 and the second electrode 205 may be set according to the specific structures of the first doped part 202 and the second doped part 203, as long as the first electrode 204 may export the first-type carriers in the top cell 201 and the bottom cell 200 and the second electrode 205 may export the second-type carriers in the top cell 201 and the bottom cell 200. In addition, arrangement modes and numbers of the first electrode 204 and the second electrode 205 may be set according to actual application scenarios, which is not limited herein. For example, the first electrode 204 and the second electrode 205 may be arranged in a matrix. As another example, when the top cell 201 is an IBC cell, distribution of the first electrode 204 and the second electrode 205 may be set according to distribution of two electrodes included in the top cell 201.

Figure 10:
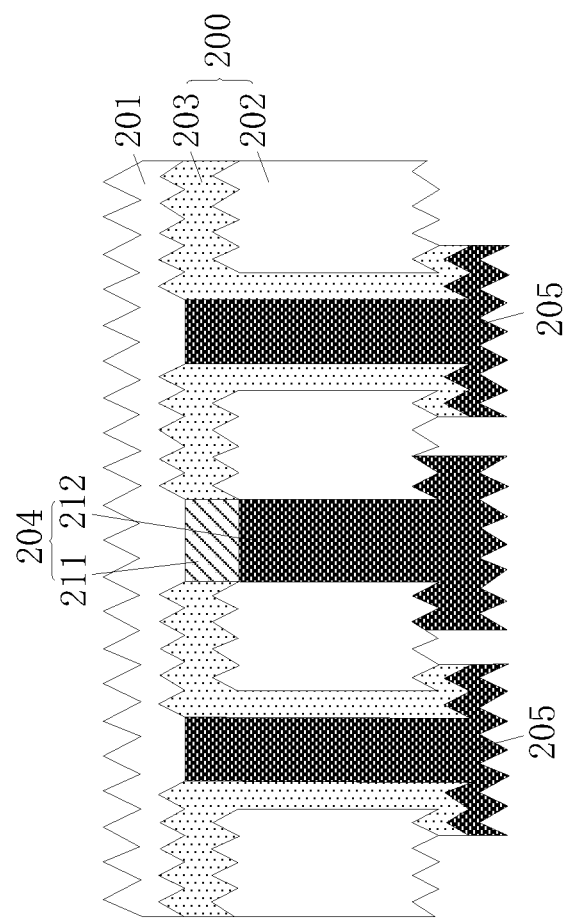
FIG. 10 is a schematic diagram of a structure of a sixth tandem solar cell according to an embodiment of the present disclosure.

In some cases, as shown in FIG. 10, in order to improve light trapping effect of the tandem solar cell, surfaces of the top cell 201, the first doped part 202, the second doped part 203, the first electrode 204 and the second electrode 205 may all be textured.

In an actual application process, as shown in FIG. 2A to FIG. 10, the first-type carriers and the second-type carriers generated after a semiconductor layer of the top cell 201 absorbs sunlight with short wavelengths may be moved in the top cell 201 along a direction close to a backlight surface of the top cell 201 and be collected by the first electrode 204 and the second electrode 205 penetrating through the bottom cell 200, respectively. However, sunlight with long wavelengths will be absorbed by the bottom cell 200 after passing through the top cell 201, and the first-type carriers and the second-type carriers may be generated in the bottom cell 200 in pairs. Then, the paired first-type carriers and second-type carriers are separated under action of a built-in electric field in the PN junction. After that, the first-type carriers are moved in a direction toward the first electrode 204 under the action of the built-in electric field, and the second-type carriers are moved in a direction toward the second electrode 205 under the action of the built-in electric field, so as to be collected by the first electrode 204 and the second electrode 205, respectively, and thus a current is generated. In addition, since the first electrode 204 penetrating through the bottom cell 200 may collect the first-type carriers in both the top cell 201 and the bottom cell 200 at the same time, and the second electrode 205 may collect the second-type carriers in both the top cell 201 and the bottom cell 200 at the same time, a connection between the top cell 201 and the bottom cell 200 included in the tandem solar cell is a parallel connection.

It may be seen from the above that, the first-type carriers and the second-type carriers generated by the top cell 201 included in the tandem solar cell according to an embodiment of the present disclosure during operation may be directly collected by the first electrode 204 and the second electrode 205 penetrating through the bottom cell 200, respectively. Therefore, probability of recombination of the first-type carriers or the second-type carriers generated in the top cell 201 with the second-type carriers or the first-type carriers generated in the bottom cell 200 when passing through the bottom cell 200 may be reduced, thereby enhancing a photovoltaic electric field generated by the bottom cell 200 under illumination, improving utilization of light energy of the tandem solar cell, and finally improving photoelectric conversion efficiency of the tandem solar cell.

In a possible implementation, as shown in FIGS. 2A to 2G, each of the at least one PN junction includes a first junction region 301 perpendicular to the top cell 201. It should be understood that when a field strength direction of the built-in electric field of the PN junction is parallel to the bottom surface of the top cell 201, the PN junction includes the first junction region 301. At this time, length extension directions of the first doped part 202 and the second doped part 203 forming the PN junction is perpendicular to the bottom surface of the top cell 201. In this case, when axial directions of the first electrode hole and the second electrode hole penetrating the bottom cell 200 are also perpendicular to the bottom surface of the top cell 201, the length extension directions of the first electrode 204 and the second electrode 205 are the same as those of the first doped part 202 and the second doped part 203, respectively, so that contact areas of the first electrode 204 and the second electrode 205 respectively with the first doped part 202 and the second doped part 203 are large. At this time, first-type carriers generated by the first doped part 202 are easily exported by the first electrode 204 under action of a built-in electric field, which reduces recombination probability of the first-type carriers in the bottom cell 200. Meanwhile, second-type carriers generated by the second doped part 203 may be easily exported by the second electrode 205 under action of the built-in electric field, which reduces recombination probability of the second-type carriers in the bottom cell 200, thus improving the photoelectric conversion efficiency of the tandem solar cell.

In an example, as shown in FIG. 2A to FIG. 2D, when the PN junction includes only the first junction region 301 perpendicular to the bottom surface of the top cell 201, the first electrode 204 may be made of a metal material, or made of a first-type carrier conducting material, and certainly, also may be made of both the metal material and the first-type carrier conducting material. It should be understood that the metal material may be aluminum, gold, silver, copper, etc. When the first-type carrier is the electron, the first-type carrier conducting material may be 8-hydroxyquinoline aluminum, titanium oxide, etc. When the first-type carrier is the hole, the first-type carrier conducting material may be aromatic diamine, aromatic triamine or polysilane.

As shown in FIG. 2A to FIG. 2D, when the PN junction formed in the bottom cell 200 only involves a case of the first junction region 301 being perpendicular to the top cell 201, a part of the first electrode 204 located in the bottom cell 200 may be in contact with the first doped part 202 included in the bottom cell 200, but not with the second doped part 203. At this time, regardless of whether the first electrode 204 is made of the metal material or the first-type carrier conducting material, under the action of the built-in electric field of the PN junction formed in the bottom cell 200, the first electrode 204 only conducts the first-type carrier generated in the bottom cell 200 and the top cell 201, but does not conduct the second-type carrier, thus expanding a material selection range of the first electrode 204. Furthermore, when the first electrode 204 is made of both the metal material and the first-type carrier material, which part of the first electrode 204 is made of the metal material and which part of the first electrode is made of the first-type carrier material may be set according to contact situations between the first electrode 204 and the second doped part 203 or according to the actual application scenarios, which is not specifically limited herein.

Figure 2A:
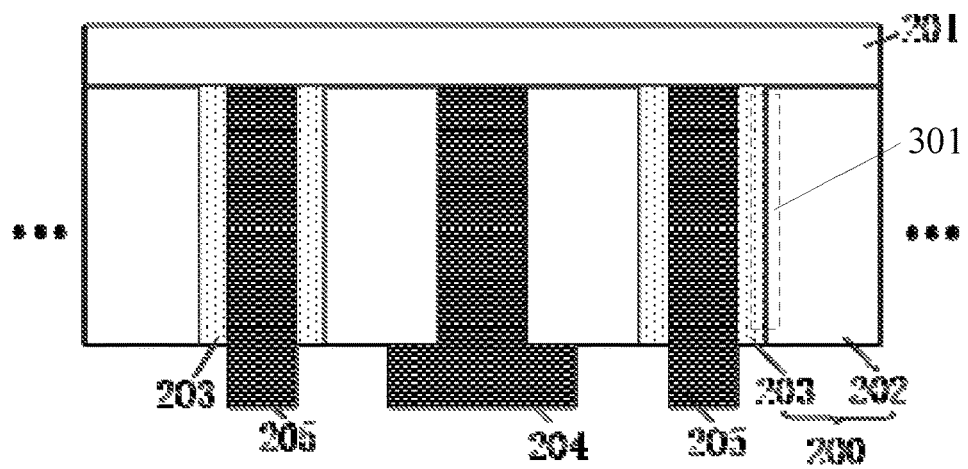
FIG. 2A is a schematic diagram of a structure of a first tandem solar cell according to an embodiment of the present disclosure.
Figure 2B:
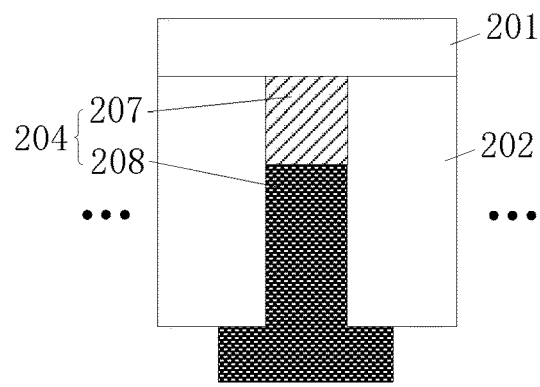
FIGS. 2B to 2D are schematic diagrams of alternative structures of a first electrode in the structure shown in FIG. 2A.
Figure 2C:
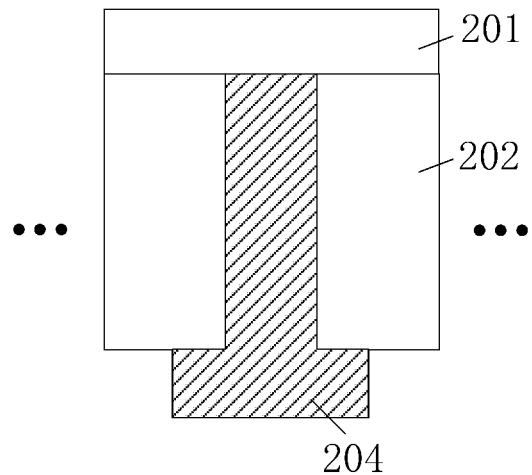

Illustratively, as shown in FIG. 2A and FIG. 2C, in a case where the PN junction only includes the first junction region 301 perpendicular to the bottom surface of the top cell 201, the first electrode 204 may be either the positive electrode or the negative electrode. When the first doped part 202 is doped with N-type impurities and the first electrode 204 is the negative electrode, a material contained in the first electrode 204 may be a metal material such as gold, silver and aluminum, or an electron conducting material such as 8-hydroxyquinoline aluminum. When the first doped part 202 is doped with P-type impurities and the first electrode 204 is the positive electrode, the material contained in the first electrode 204 may be the metal material such as gold, silver and aluminum, or a hole conducting material such as aromatic diamine.

Figure 2D:
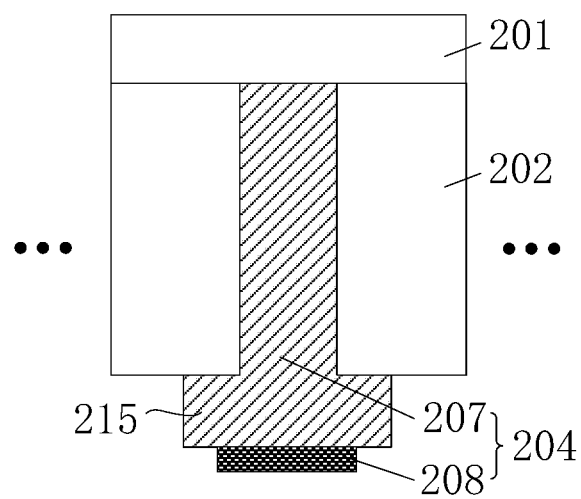

Illustratively, as shown in FIG. 2B and FIG. 2D, in a case where the PN junction only includes the first junction region 301 perpendicular to the bottom surface of the top cell 201, when the first electrode 204 is made of the metal material and the first-type carrier conducting material, each first electrode 204 may include the first conducting part 207 and the first metal part 208 distributed in the direction away from the top cell 201. At least part of the first conducting part 207 is located in a corresponding first electrode hole. The first conducting part 207 may be made of the first-type carrier conducting material. The first metal part 208 may be made of the metal material. Specifically, specifications of the first conducting part 207 and the first metal part 208 included in the first electrode 204 may be set according to actual situation, which are not specifically limited herein.

For example, as shown in FIG. 2B, at least part of the first metal part 208 is located in a corresponding first electrode hole. At this time, a specification of the first metal part 208 located in the first electrode hole may be appropriately increased so as to increase a conduction rate of the first-type carrier in the first electrode 204, and thus improving the photoelectric conversion efficiency of the tandem solar cell. In addition, when at least part of the first metal part 208 is located in the corresponding first electrode hole, the first metal part 208 may also extend out of the first electrode hole in a direction away from the top cell 201. A specification of a part of the first metal part 208 extending out of the first electrode hole may be set according to actual applications, which is not specifically limited herein.

For example, as shown in FIG. 2D, the first metal part 208 is located outside the first electrode hole. At this time, the first conducting part 207 which only transmits the first-type carriers at least fills full the first electrode hole. In addition, along the direction away from the top cell 201, the first conducting part 207 may also extend out of the first electrode hole. The part of the first conducting part 207 located outside the first electrode hole and a specific structure of the first metal part 208 may be set according to actual application scenarios.

It can be seen from the above that each first electrode 204 includes the first conducting part 207 at least partially located in the corresponding first electrode hole and made of the first-type carrier conducting material, so that each first electrode 204 has good carrier-conduction selectivity. Furthermore, since the metal material has better conductive characteristics than the first-type carrier conducting material, when the first electrode 204 further includes the first metal part 208 located on a surface of the first conducting part 207 away from the top cell 201, conductivity of the first electrode 204 may be improved.

In an example, as shown in FIG. 2A and FIG. 2E to FIG. 2G, when the PN junction only includes the first junction region 301 perpendicular to the bottom surface of the top cell 201, the second electrode 205 may be made of a metal material or a second-type carrier conducting material, and certainly, also may be made of both the metal material and the second-type carrier conducting material. The metal material and the second-type carrier conducting material used for manufacturing the second electrode 205 may be selected with reference to the material of the first electrode 204 described above.

As shown in FIG. 2A and FIG. 2E to FIG. 2G, under the condition that the PN junction formed in the bottom cell 200 only includes the first junction region 301 being perpendicular to the top cell 201, a part of the second electrode 205 located in the bottom cell 200 may be in contact with the second doped part 203 included in the bottom cell 200, but not with the first doped part 202. At this time, regardless of whether the second electrode 205 is made of the metal material or the second-type carrier conducting material, under the action of the built-in electric field of the PN junction formed in the bottom cell 200, the second electrode 205 only conducts the second-type carrier generated in the bottom cell 200 and the top cell 201, but does not conduct the first-type carrier, thus expanding a material selection range of the second electrode 205. Furthermore, when the second electrode 205 is made of both the metal material and the second-type carrier material, which part of the second electrode 205 is made of the metal material and which part of the second electrode is made of the second-type carrier material may be set according to contact situations between the second electrode 205 and the first doped part 202 or according to the actual application scenarios, which is not specifically limited herein.

Figure 2E:
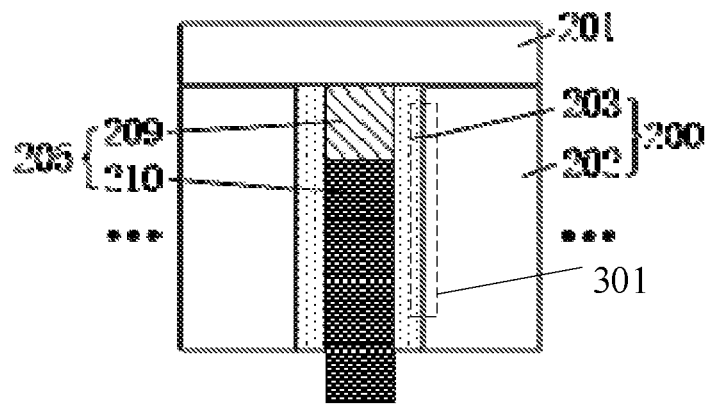
FIGS. 2E to 2G are schematic diagrams of alternative structures of the second electrode in the structure shown in FIG. 2A.
Figure 2F:
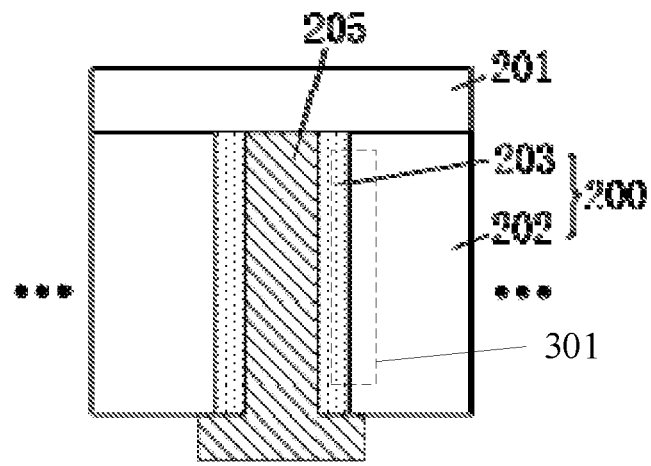

Illustratively, as shown in FIG. 2A and FIG. 2F, in a case where the PN junction only includes the first junction region 301 perpendicular to the bottom surface of the top cell 201 and when the first electrode 204 is the positive electrode, the second electrode 205 is the negative electrode. At this time, a material contained in the second electrode 205 may be a metal material such as gold, silver and aluminum, or an electron conducting material such as 8-hydroxyquinoline aluminum. When the first electrode 204 is the negative electrode, the second electrode 205 is the positive electrode. At this time, the material contained in the second electrode 205 may be the metal material such as gold, silver and aluminum, or a hole conducting material such as aromatic diamine.

Figure 2G:
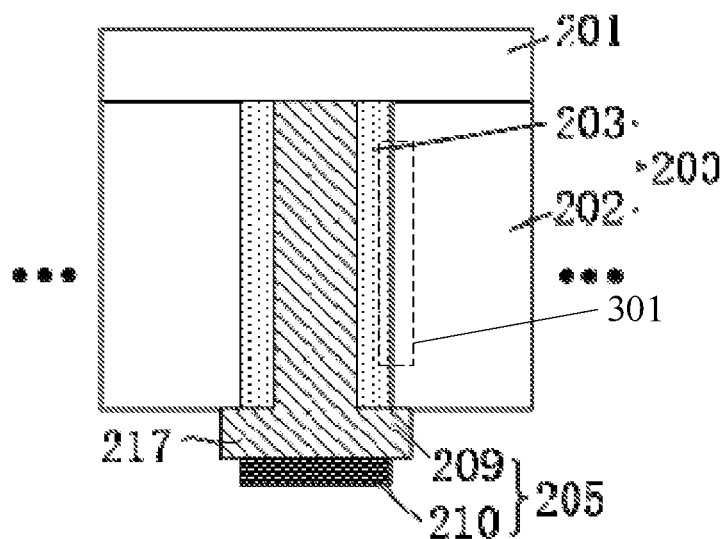

Illustratively, as shown in FIG. 2E and FIG. 2G, in a case where the PN junction only includes the first junction region 301 perpendicular to the bottom surface of the top cell 201, when the second electrode 205 is made of the metal material and the second-type carrier conducting material, the second electrode 205 may include the second conducting part 209 and the second metal part 210 distributed in the direction away from the top cell 201. At least part of the second conducting part 209 is located in a corresponding second electrode hole. The second conducting part 209 may be made of the second-type carrier conducting material. The second metal part 210 may be made of the above metal materials. Specifically, specifications of the second conducting part 209 and the second metal part 210 included in the second electrode 205 may be set according to actual situation, which are not specifically limited herein.

For example, as shown in FIG. 2E, at least part of the second metal part 210 is located in a corresponding second electrode hole. At this time, a specification of the second metal part 210 located in the second electrode hole may be appropriately increased so as to increase a conduction rate of the second-type carrier in the second electrode 205, and thus improving the photoelectric conversion efficiency of the tandem solar cell. In addition, when at least part of the second metal part 210 is located in the corresponding second electrode hole, the second metal part 210 may also extend out of the second electrode hole in a direction away from the top cell 201. A specification of a part of the second metal part 210 extending out of the second electrode hole may be set according to actual applications, which is not specifically limited herein.

As another example, the second metal part 210 is located outside the second electrode hole. At this time, the second conducting part 209 which only transmits the second-type carriers at least fills full the second electrode hole. Specifically, along the direction away from the top cell 201, the second conducting part 209 may also extend out of the second electrode hole. The part of the second conducting part 209 located outside the second electrode hole and a specific structure of the second metal part 210 may be set according to actual application scenarios.

It can be seen from the above that each second electrode 205 includes the second conducting part 209 at least partially located in the corresponding second electrode hole and made of the second-type carrier conducting material, so that each second electrode 205 has good carrier-conduction selectivity. Furthermore, since the metal material has good conductive characteristics compared with the second-type carrier conducting material, when the second electrode 205 further includes the second metal part 210 located on a surface of the second conducting part 209 away from the top cell 201, conductivity of the second electrode 205 may be improved.

It should be noted that in a case that the PN junction only includes the first junction region 301 perpendicular to the bottom surface of the top cell 201, the first electrode 204 and the second electrode 205 of different structures shown in FIG. 2A to FIG. 2G may be arbitrarily combined. For example, when the PN junction only includes the first junction region 301 perpendicular to the bottom surface of the top cell 201, the first electrode 204 penetrating through the bottom cell 200 may be the first electrode 204 shown in FIG. 2B. The second electrode 205 penetrating the bottom cell 200 may be the second electrode 205 shown in FIG. 2E.

In a possible implementation, as shown in FIG. 3A to FIG. 3E, each PN junction includes a second junction region parallel to the bottom surface of the top cell 201. It should be understood that the second doped part 203 may be at least partially located on a surface of the first doped part 202 toward the top cell 201. At this time, the second junction region included in the PN junction is parallel and close to the bottom surface of the top cell 201. In addition, the second doped part 203 may be at least partially located on a surface of the first doped part 202 away from the top cell 201. At this time, the second junction region included in the PN junction is parallel and close to a bottom surface of the bottom cell 200. A specific position of the second junction region may be set according to the actual situation, which is not specifically limited herein.

Illustratively, as shown in FIG. 3A to FIG. 3E, the second doped part 203 may be located between the first doped part 202 and the top cell 201. Accordingly, the PN junction formed by the first doped part 202 and the second doped part 203 only includes the second junction region parallel to and close to the bottom surface of the top cell 201. In addition, both the first electrode 204 and the second electrode 205 penetrate through the first doped part 202 and the second doped part 203. At this time, the first doped part 202 and the second doped part 203 included in the bottom cell 200 are in a tandem structure stacked together along a thickness direction of the bottom cell 200. Therefore, when the bottom cell 200 is manufactured, the first doped part 202 and the second doped part 203 may be manufactured by a mature deposition process, which reduces manufacturing difficulty of the tandem solar cell. Moreover, when the PN junction includes a second junction region parallel and close to the bottom surface of the top cell 201, a PN junction interface is parallel to a light receiving surface of the bottom cell 200, and sunlight may be uniformly irradiated on the whole PN junction interface after being transmitted into the bottom cell 200 from the light receiving surface of the bottom cell 200, so that balanced numbers of first-type carriers and second-type carriers are generated in respective areas of the bottom cell 200, and probability of recombination caused by uneven distribution of two types of carriers when the first-type carriers are moved to the first doped part 202 and the second-type carriers are move to the second doped part 203 may be reduced, and thus a larger current may be formed when an external circuit is connected, and operation performance of the tandem solar cell may be improved.

In an alternative way, as shown in FIG. 3A to FIG. 3D, when each PN junction only includes the second junction region parallel to the bottom surface of the top cell 201, the first electrode 204 may be made of the first-type carrier conducting material, or also may be made of both the metal material and the first-type carrier conducting material. Specifically, types of the metal material and the first-type carrier conducting material may be referred to the foregoing, which will not be repeatedly described here again.

Figure 3A:
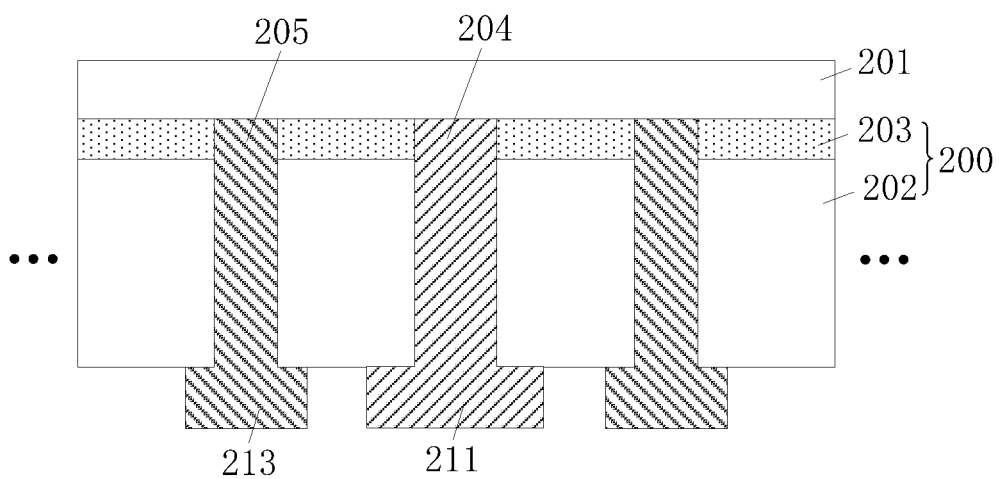
FIG. 3A is a schematic diagram of a structure of a second tandem solar cell according to an embodiment of the present disclosure.

For example, as shown in FIG. 3A, when each PN junction only includes the second junction region parallel to the bottom surface of the top cell 201, the first electrode 204 may be only made of the first-type carrier conducting material. At this time, respective parts of the first electrode 204 have good carrier conduction selectivity. For example, when the first doped part 202 is doped with N-type impurities and the first electrode 204 is the negative electrode, the material contained in the first electrode 204 may be an electron conducting material such as 8-hydroxyquinoline aluminum. In this case, respective parts of the first electrode 204 has good electron conduction selectivity. For example, when the first doped part 202 is doped with P-type impurities and the first electrode 204 is the positive electrode, the material contained in the first electrode 204 may be a hole conducting material such as aromatic diamine. In this case, respective parts of the first electrode 204 has good hole conduction selectivity.

Figure 3B:
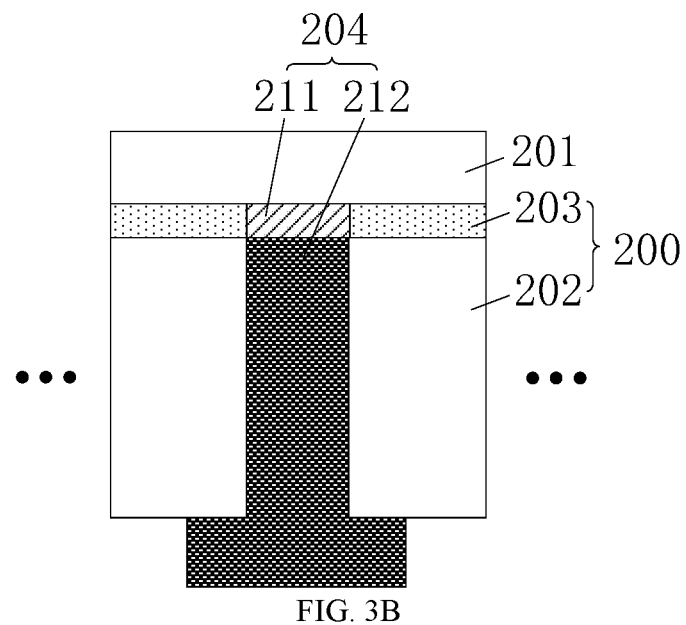
FIGS. 3B to 3D are schematic diagrams of alternative structures of a first electrode in the structure shown in FIG. 3A.
Figure 3C:
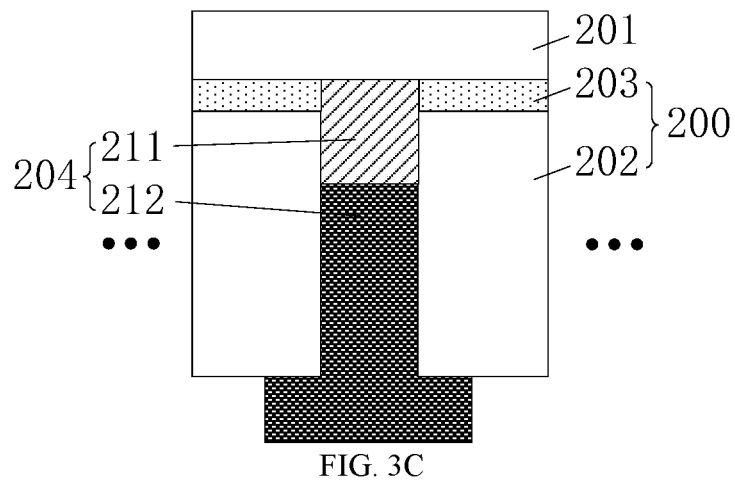
Figure 3D:
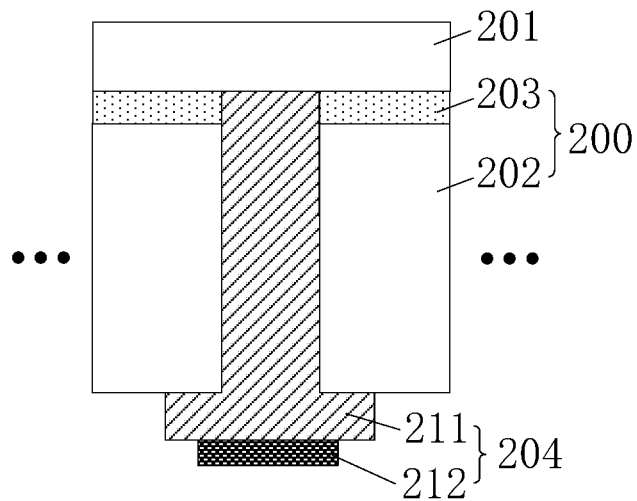

Illustratively, as shown in FIG. 3B to FIG. 3D, in a case where each PN junction only includes the second junction region parallel to the bottom surface of the top cell 201, when the first electrode 204 is made of the metal material and the first-type carrier conducting material, each first electrode 204 may include a third conducting part 211 and a third metal part 212 distributed in a direction away from the top cell 201. A part of the first electrode 204 contacting with the second doped part 203 is set as the third conducting part 211. The third conducting part 211 may be made of the first-type carrier conducting material. At least part of the third conducting part 211 is located in a corresponding first electrode hole. The third metal part 212 may be made of a metal material. Materials of the third conducting part 211 and the third metal part 212 may be referred to materials of the first conducting part 207 and the first metal part 208.

As shown in FIG. 3B to FIG. 3D, when each PN junction only includes the second junction region parallel to the bottom surface of the top cell 201, a part of the first electrode 204 located in the first electrode hole is in contact with both the first doped part 202 and the second doped part 203. At this time, along an axial direction of the first electrode hole, a length of the third conducting part 211 included in the first electrode 204 in the first electrode hole may be set according to contact situations between the first electrode 204 and the second doped part 203 so as to prevent short circuit of the PN junction.

For example, as shown in FIG. 3B and FIG. 3C, at least part of the third metal part 212 is located in a corresponding first electrode hole. At this time, in a case where it is ensured that a part of the first electrode 204 contacting with the second doped part 203 is the third conducting part 211, a specification of the third metal part 212 located in the first electrode hole may be appropriately increased so as to increase a conduction rate of the first-type carrier in the first electrode 204, and thus improving the photoelectric conversion efficiency of the tandem solar cell.

As another example, as shown in FIG. 3D, the third metal part 212 is located outside the first electrode hole. Specifically, when the first electrode 204 is in a structure shown in FIG. 3D, related description of the first electrode 204 may be referred to previous description of the first electrode 204 shown in FIG. 2D, which will not be repeatedly described here again.

Figure 3E:
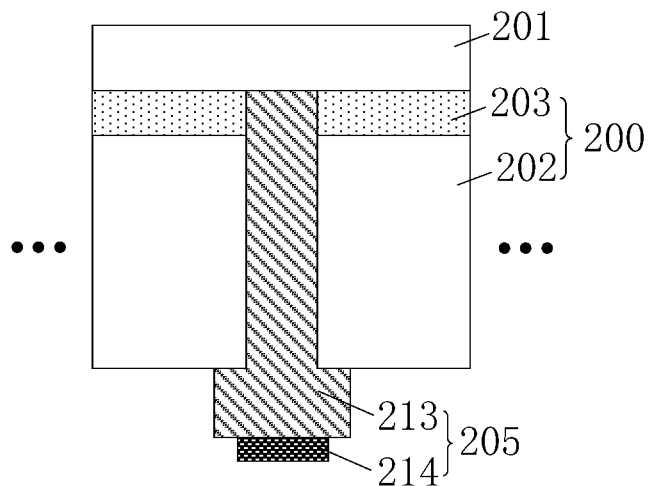
FIG. 3E is a schematic diagram of an alternative structure of the second electrode in the structure shown in FIG. 3A.

In an alternative way, as shown in FIG. 3A and FIG. 3E, when each PN junction only includes the second junction region parallel to the bottom surface of the top cell 201, the second electrode 205 may be made of the second-type carrier conducting material, or also may be made of both the metal material and the second-type carrier conducting material. Types of the metal material and the second-type carrier conducting material may be referred to the foregoing, which will not be repeatedly described here again.

For example, as shown in FIG. 3A, when each PN junction only includes the second junction region parallel to the bottom surface of the top cell 201, the first electrode 205 may be only made of the second-type carrier conducting material. At this time, respective parts of the second electrode 205 have good carrier conduction selectivity. Specifically, when the first electrode 204 is the positive electrode, the second electrode 205 is the negative electrode, and the material contained in the second electrode 205 may be an electron conducting material such as 8-hydroxyquinoline aluminum. In this case, the second electrode 205 has good electron conduction selectivity. When the first electrode 204 is the negative electrode, the second electrode 205 contains a hole conducting material such as aromatic diamine. In this case, respective parts of the second electrode 205 has good hole conduction selectivity.

Illustratively, as shown in FIG. 3E, in a case where each PN junction only includes the second junction region parallel to the bottom surface of the top cell 201, when the second electrode 205 is made of the metal material and the second-type carrier conducting material, each second electrode 205 may include a fourth conducting part 213 and a fourth metal part 214 distributed in a direction away from the top cell 201. A part of the second electrode 205 contacting with the first doped part 202 is set as a fourth conducting part 213. The fourth conducting part 213 may be made of the second-type carrier conducting material. At least part of the fourth conducting part 213 is located in a corresponding second electrode hole. The fourth metal part 214 may be made of a metal material. The fourth metal part 214 is located outside the second electrode hole. At this time, the fourth conducting part 213 may at least fill full the second electrode hole, so as to prevent the fourth metal part 214 from contacting the first doped part 202 and avoid the short circuit of the PN junction.

It should be noted that in a case that the PN junction only includes the second junction region parallel to the bottom surface of the top cell 201, the first electrode 204 and the second electrode 205 of different structures shown in FIG. 3A to FIG. 3E may be arbitrarily combined. For example, when the above PN junction only includes the second junction region parallel to the bottom surface of the top cell 201, the first electrode 204 penetrating through the bottom cell 200 may be the first electrode 204 shown in FIG. 3D. The second electrode 205 penetrating through the bottom cell 200 may be the second electrode 205 shown in FIG. 3E.

Figure 4A:
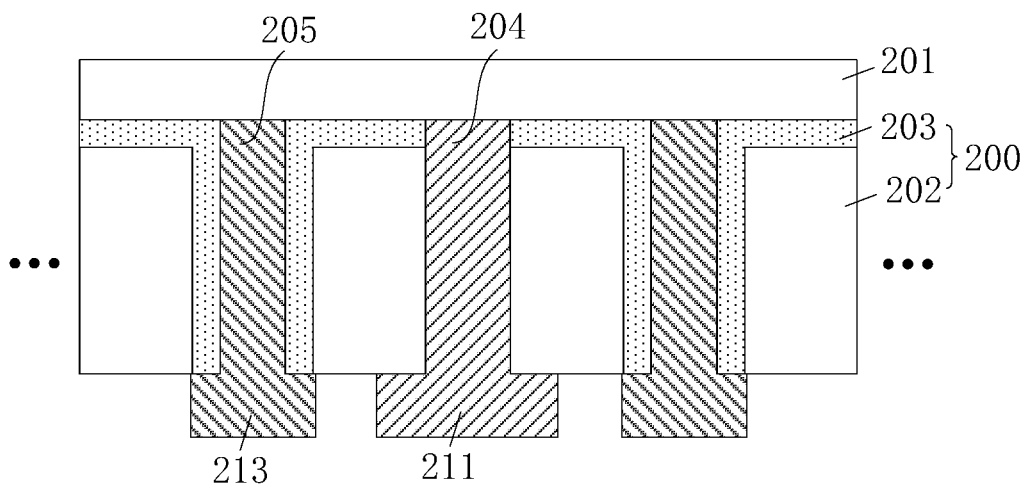
FIG. 4A is a schematic diagram of a structure of a third tandem solar cell according to an embodiment of the present disclosure.
Figure 4B:
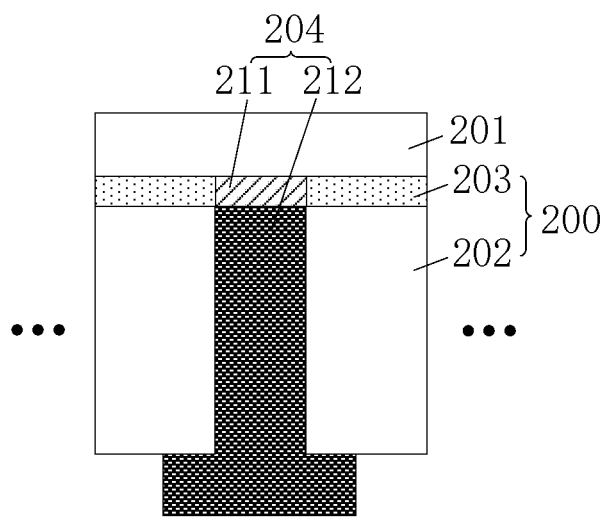
FIGS. 4B to 4D are schematic diagrams of alternative structures of a first electrode in the structure shown in FIG. 4A.
Figure 4C:
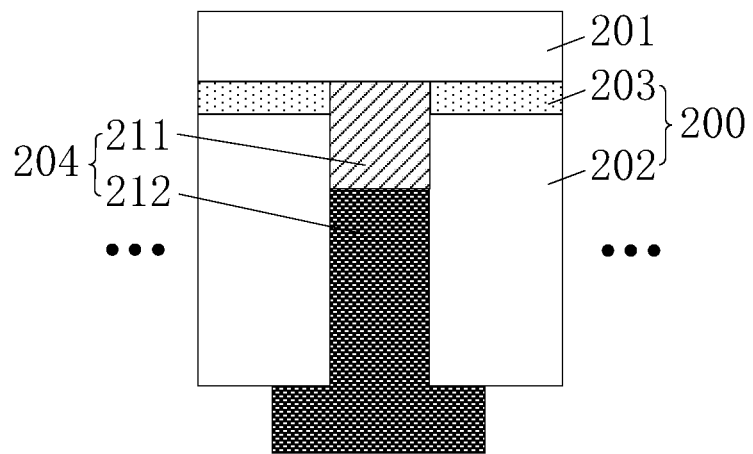
Figure 4D:
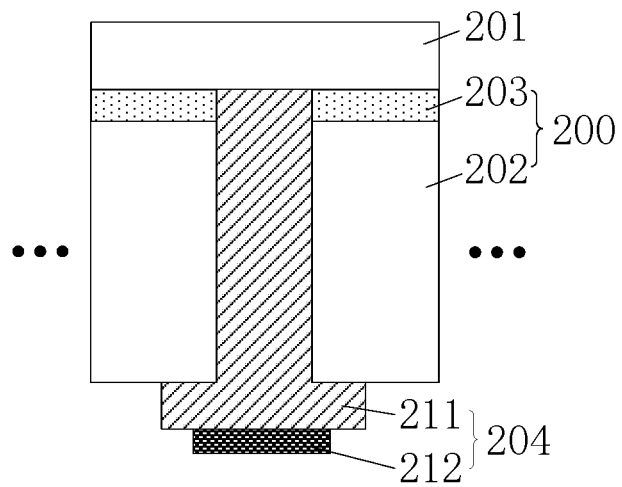
Figure 4E:
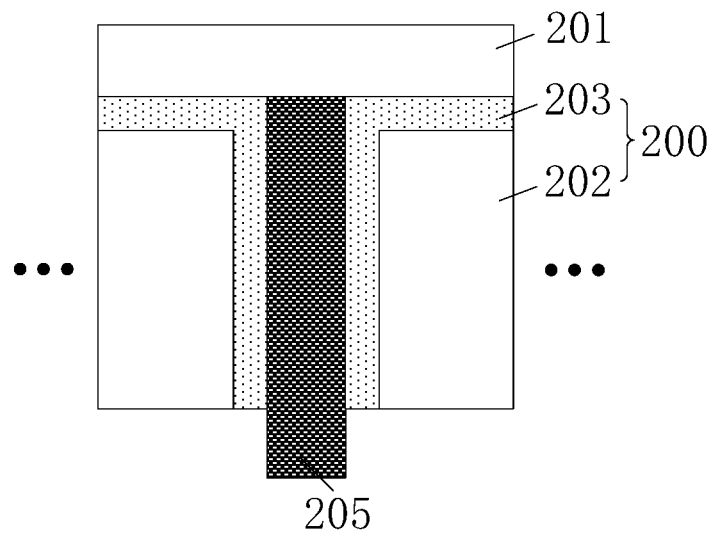
FIGS. 4E to 4G are schematic diagrams of alternative structures of the second electrode in the structure shown in FIG. 4A.
Figure 4F:
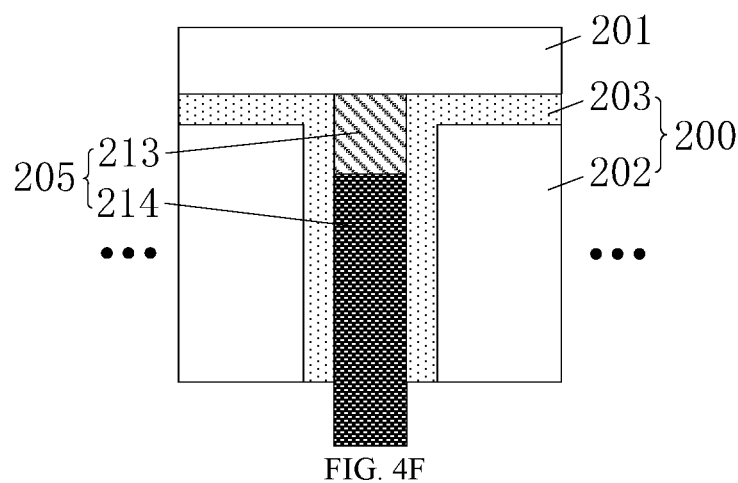
Figure 4G:
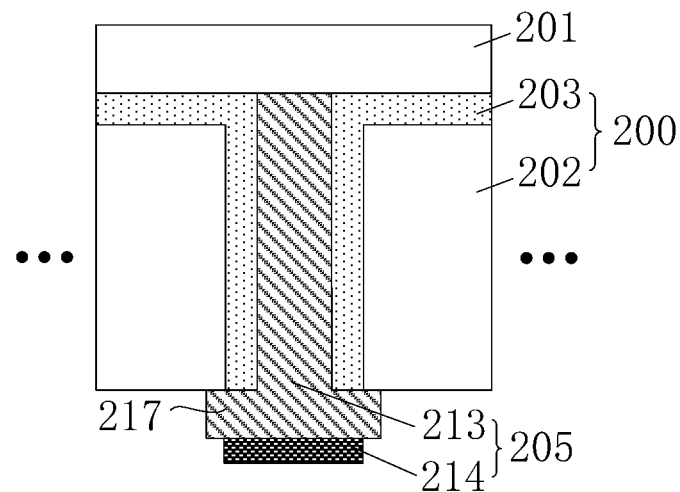
Figure 5A:
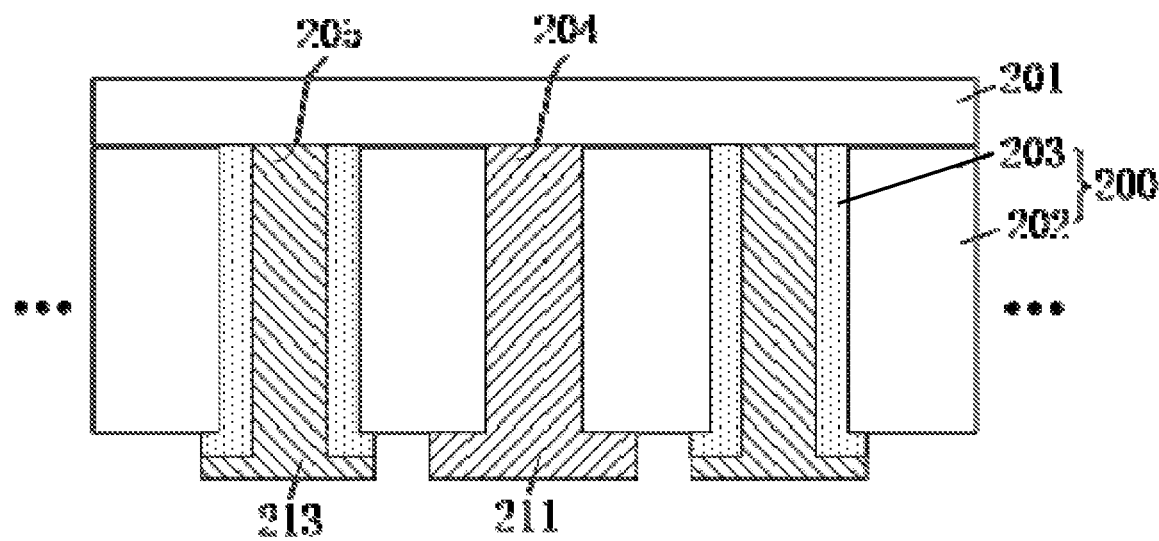
FIG. 5A is a schematic diagram of a structure of a fourth tandem solar cell according to an embodiment of the present disclosure.
Figure 5B:
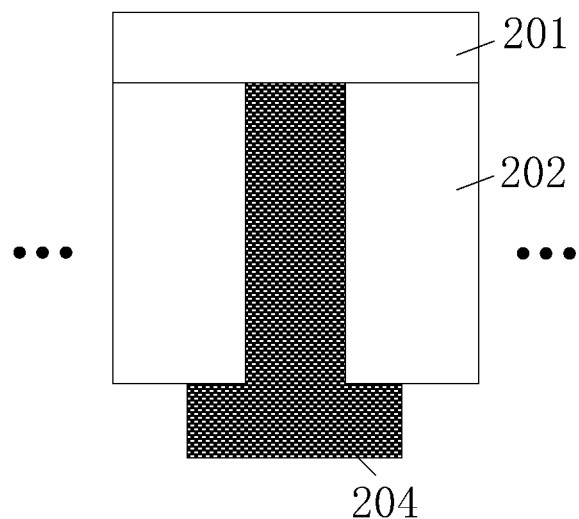
FIGS. 5B to 5D are schematic diagrams of alternative structures of a first electrode in the structure shown in FIG. 5A.
Figure 5C:
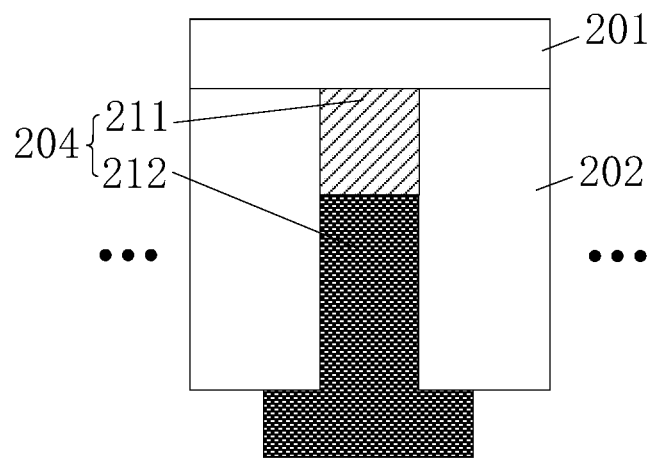
Figure 5D:
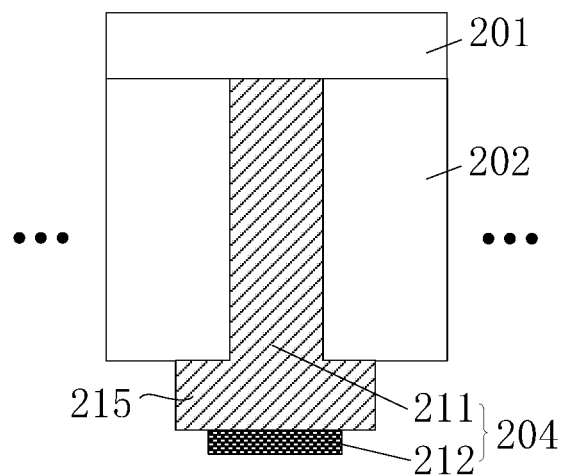
Figure 5E:
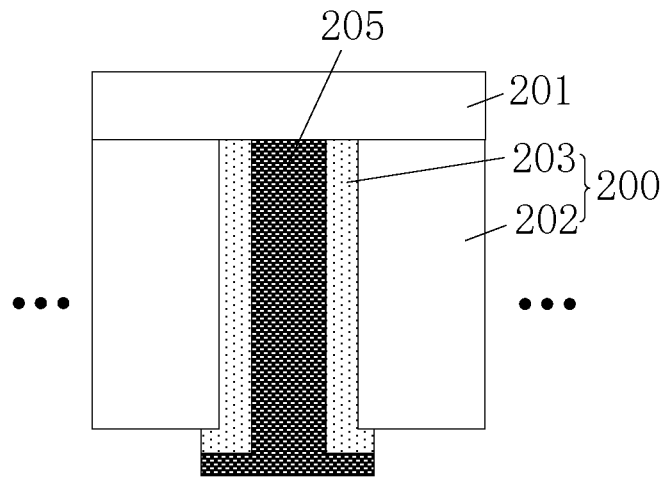
FIGS. 5E to 5G are schematic diagrams of alternative structures of the second electrode in the structure shown in FIG. 5A.
Figure 5F:
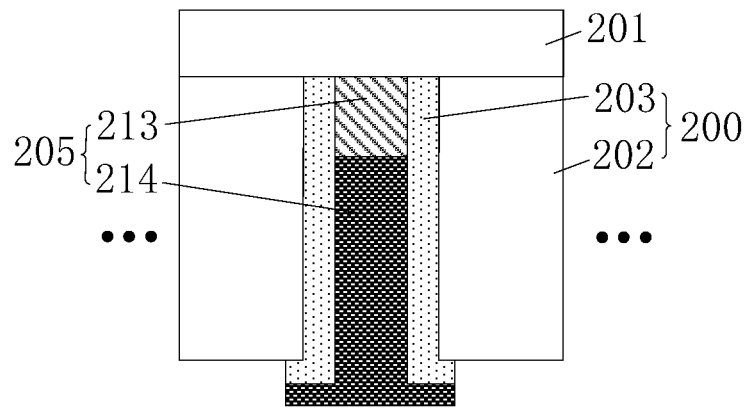
Figure 5G:
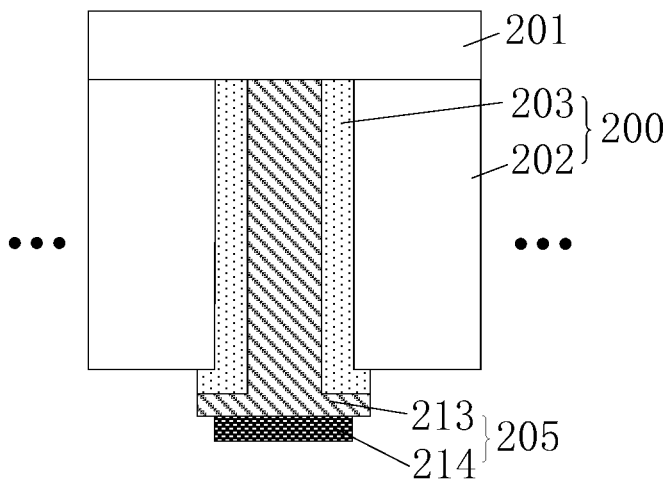
Figure 6A:
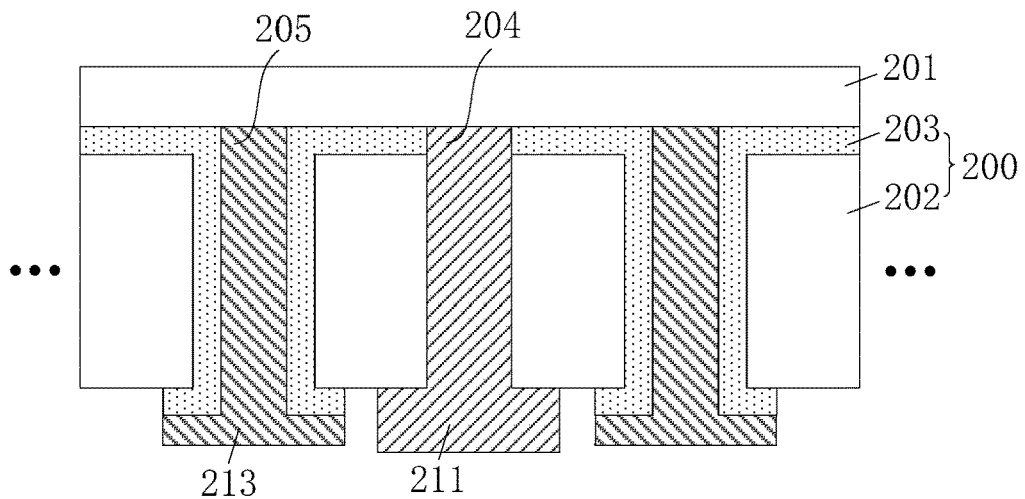
FIG. 6A is a schematic diagram of a structure of a fifth tandem solar cell according to an embodiment of the present disclosure.
Figure 6B:
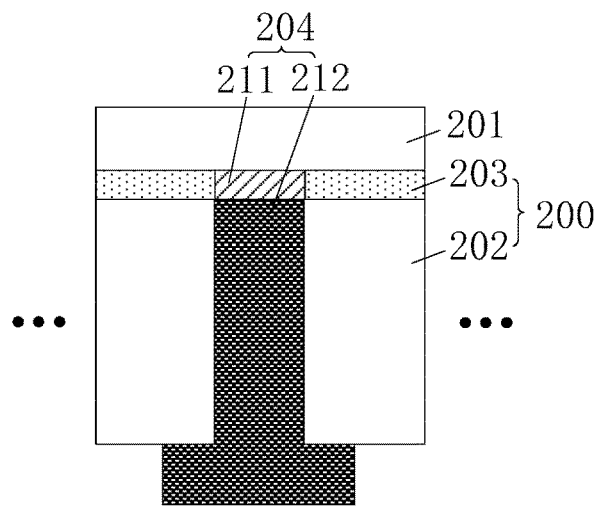
FIGS. 6B to 6D are schematic diagrams of alternative structures of a first electrode in the structure shown in FIG. 6A.
Figure 6C:
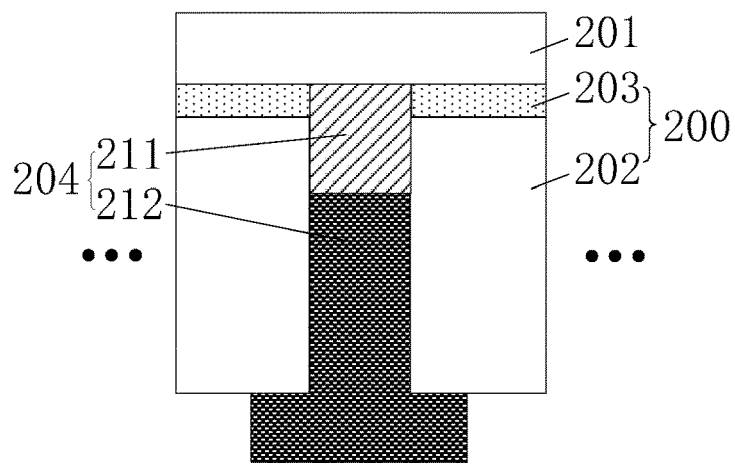
Figure 6D:
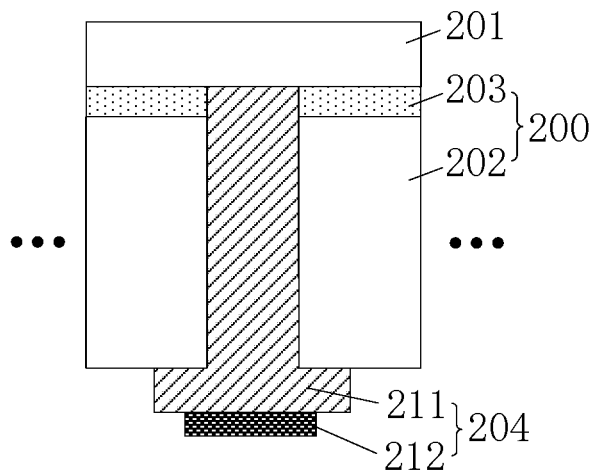
Figure 6E:
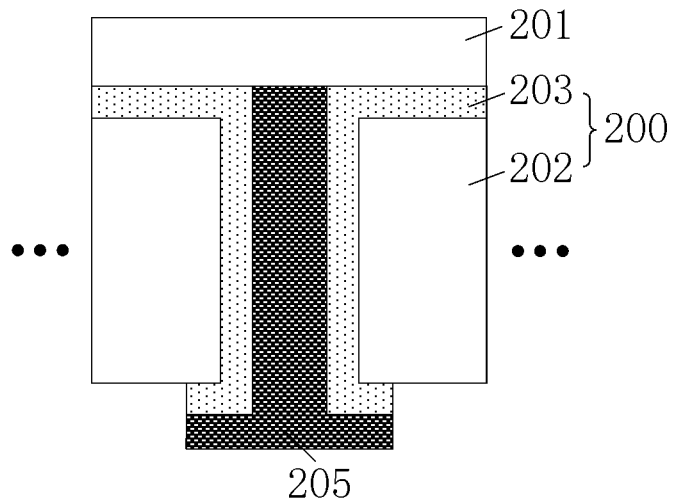
FIGS. 6E to 6G are schematic diagrams of alternative structures of the second electrode in the structure shown in FIG. 6A.
Figure 6F:
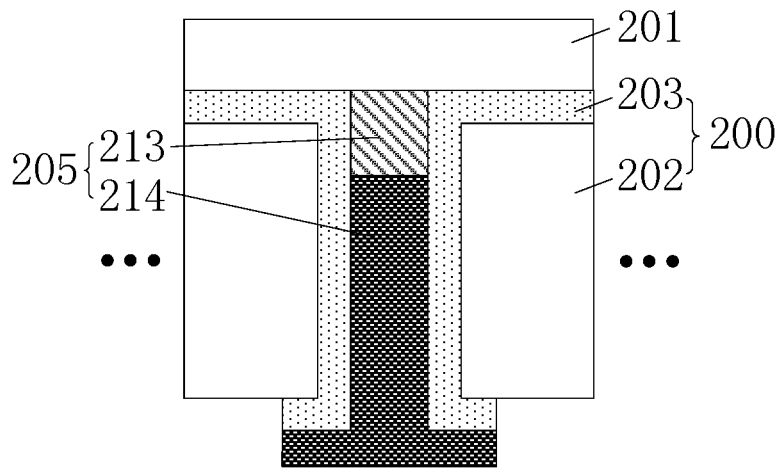
Figure 6G:
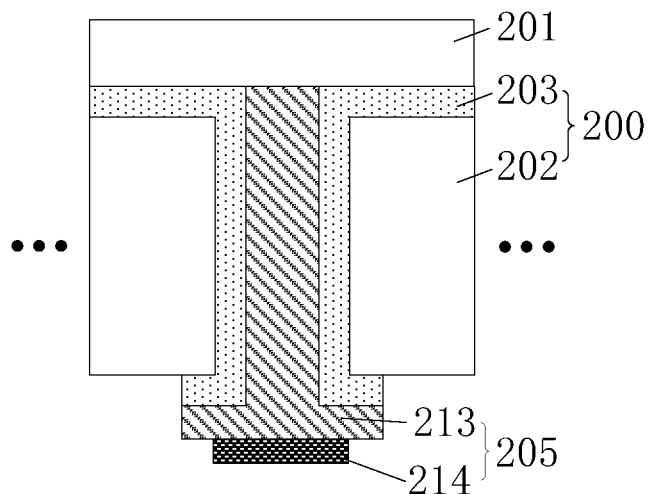

In a possible implementation, as shown in FIG. 4A, FIG. 5A and FIG. 6A, each PN junction includes the first junction region 301 perpendicular to the top cell 201 and the second junction region parallel to the bottom surface of the top cell 201. A relative position relationship between the first junction region 301 and the second junction region may be set according to the actual application scenarios, which is not specifically limited here.

In an alternative way, as shown in FIG. 4A to FIG. 4G, the PN junction formed by the first doped part 202 and the second doped part 203 includes both the second junction region close to the bottom surface of the top cell 201 and the first junction region 301 perpendicular to the bottom surface of the top cell 201.

In one example, as shown in FIG. 4A to FIG. 4D, when the PN junction includes both the second junction region close to the bottom surface of the top cell 201 and the first junction region 301 perpendicular to the bottom surface of the top cell 201, the first electrode 204 may be made of the first-type carrier conducting material, or may be made of the metal material and the first-type carrier conducting material. For example, as shown in FIG. 4A, the part of the first electrode 204 contacting with the second doped part 203 is set as the third conducting part 211. In addition, the third conducting part 211 at least fills full the first electrode hole, and the third conducting part 211 may be made of the first-type carrier conducting material.

Specifically, for description of a specific structure of the first electrode 204 shown in FIG. 4A to FIG. 4D, it may be referred to previous description of the specific structure of the first electrode 204 shown in FIG. 3A to FIG. 3D, which will not be repeatedly described here again.

In an example, as shown in FIG. 4A and FIG. 4E to FIG. 4G, when the PN junction includes both the second junction region close to the bottom surface of the top cell 201 and the first junction region 301 perpendicular to the bottom surface of the top cell 201, the second electrode 205 may be made of the metal material or may be made of the second-type carrier conducting material. Certainly, the second electrode 205 also may be made of the metal material and the second-type carrier conducting material. For example, as shown in FIG. 4A, the part of the second electrode 205 contacting the first doped part 202 is set as the fourth conducting part 213. In addition, the fourth conducting part 213 at least fills full the second electrode hole, and the fourth conducting part 213 may be made of the second-type carrier conducting material.

Specifically, for the description of a specific structure of the second electrode 205 shown in FIG. 4A and FIG. 4E to FIG. 4G, it may be referred to previous description of the specific structure of the second electrode 205 shown in FIG. 2A and FIG. 2E to FIG. 2G, which will not be repeatedly described here again.

It should be noted that in a case where the PN junction includes both the second junction region close to the bottom surface of the top cell 201 and the first junction region 301 perpendicular to the bottom surface of the top cell 201, the first electrode 204 and the second electrode 205 with different structures shown in FIG. 4A to FIG. 4G may be arbitrarily combined. For example, when the PN junction includes both the second junction region close to the bottom surface of the top cell 201 and the first junction region 301 perpendicular to the bottom surface of the top cell 201, the first electrode 204 penetrating through the bottom cell 200 may be the first electrode 204 shown in FIG. 4D. The second electrode 205 penetrating through the bottom cell 200 may be the second electrode 205 shown in FIG. 4E.

In an alternative way, as shown in FIG. 5A to FIG. 5G, the PN junction formed by the first doped part 202 and the second doped part 203 includes both the second junction region close to the bottom surface of the bottom cell 200 and the first junction region 301 perpendicular to the bottom surface of the top cell 201.

In one example, as shown in FIG. 5A to FIG. 5D, when the PN junction includes both the second junction region close to the bottom surface of the bottom cell 200 and the first junction region 301 perpendicular to the bottom surface of the top cell 201, the first electrode 204 may be made of the metal material or may be made of the first-type carrier conducting material. Certainly, the material of the first electrode 204 may also include a metal material and a first-type carrier conducting material. For example, as shown in FIG. 5A, the part of the first electrode 204 contacting the second doped part 203 is set as the third conducting part 211. In addition, the third conducting part 211 at least fills full the first electrode hole, and the third conducting part 211 may be made of the first-type carrier conducting material.

Specifically, for description of a specific structure of the first electrode 204 shown in FIG. 5A to FIG. 5D, it may be referred to previous description of the specific structure of the first electrode 204 shown in FIG. 2A to FIG. 2D, which will not be repeatedly described here again.

In an example, as shown in FIG. 5A and FIG. 5E to FIG. 5G, when the PN junction includes both the second junction region close to the bottom surface of the bottom cell 200 and the first junction region 301 perpendicular to the bottom surface of the top cell 201, the second electrode 205 may be made of the metal material or may be made of the second-type carrier conducting material. Certainly, the second electrode 205 also may be made of both the metal material and the second-type carrier conducting material. For example, as shown in FIG. 5A, the part of the second electrode 205 contacting the first doped part 202 is set as the fourth conducting part 213. In addition, the fourth conducting part 213 at least fills full the second electrode hole, and the fourth conducting part 213 may be made of the second-type carrier conducting material.

Specifically, for the description of a specific structure of the second electrode 205 shown in FIG. 5A and FIG. 5E to FIG. 5G, it may be referred to previous description of the specific structure of the second electrode 205 shown in FIG. 2A and FIG. 2E to FIG. 2G, which will not be repeatedly described here again. Differently, compared with the PN junction shown in FIG. 2A, the PN junction shown in FIG. 5A further includes the second junction region close to the bottom surface of the bottom cell 200, and at this time, at least part of the second doped part 203 is located on the surface of the first doped part 202 away from the top cell 201. In this case, when the material of the second electrode 205 is a metal material, the second electrode 205 shown in FIG. 5E may extend out of the second electrode hole in the direction away from the top cell 201. In addition, the part of the second electrode 205 extending out of the second electrode hole may extend in a direction parallel to the bottom surface of the bottom cell 200, and an extending length thereof may be set according to the specification of the part of the second doped part 203 located on the bottom surface of the bottom cell 200. Similarly, the fourth metal part 214 included in the second electrode 205 shown in FIG. 5F may extend out of the second electrode hole in the direction away from the top cell 201. In addition, a part of the fourth metal part 214 extending out of the second electrode hole may also extend in the direction parallel to the bottom surface of the bottom cell 200.

It should be noted that in a case where the PN junction includes both the second junction region close to the bottom surface of the bottom cell 200 and the first junction region 301 perpendicular to the bottom surface of the top cell 201, the first electrode 204 and the second electrode 205 with different structures shown in FIG. 5A to FIG. 5G may be arbitrarily combined. For example, when the PN junction includes both the second junction region close to the bottom surface of the bottom cell 200 and the first junction region 301 perpendicular to the bottom surface of the top cell 201, the first electrode 204 penetrating through the bottom cell 200 may be the first electrode 204 shown in FIG. 5D. The second electrode 205 penetrating through the bottom cell 200 may be the second electrode 205 shown in FIG. 5E.

In yet another alternative way, as shown in FIG. 6A to FIG. 6G, the PN junction includes the second junction region close to the bottom surface of the top cell 201 and the bottom surface of the bottom cell 200, and the first junction region 301 perpendicular to the bottom surface of the top cell 201, it forms the second junction region on both sides close to and away from the top cell 201, and an interface of the PN junction formed by the first doped part 202 and the second doped part 203 is the largest.

In one example, as shown in FIG. 6A to FIG. 6D, when the PN junction includes the second junction region close to the bottom surface of the top cell 201 and the bottom surface of the bottom cell 200, and the first junction region 301 perpendicular to the bottom surface of the top cell 201, the first electrode 204 may be made of the first-type carrier conducting material, or may be made of both the metal material and the first-type carrier conducting material. For example, as shown in FIG. 6A, the part of the first electrode 204 contacting the second doped part 203 is set as the third conducting part 211. In addition, the third conducting part 211 at least fills full the first electrode hole, and the third conducting part 211 may be made of the first-type carrier conducting material.

Specifically, for description of a specific structure of the first electrode 204 shown in FIG. 6A to FIG. 6D, it may be referred to previous description of the specific structure of the first electrode 204 shown in FIG. 3A to FIG. 3D, which will not be repeatedly described here again.

In an example, as shown in FIG. 6A and FIG. 6E to FIG. 6G, when the PN junction includes the second junction region close to the bottom surface of the top cell 201 and the bottom surface of the bottom cell 200, and the first junction region 301 perpendicular to the bottom surface of the top cell 201, the second electrode 205 may be made of the metal material or the second-type carrier conducting material. Certainly, the second electrode 205 also may be made of both the metal material and the second-type carrier conducting material. For example, as shown in FIG. 6A, the part of the second electrode 205 contacting the first doped part 202 is set as the fourth conducting part 213. In addition, the fourth conducting part 213 at least fills full the second electrode hole, and the fourth conducting part 213 may be made of the second-type carrier conducting material.

Specifically, for the description of a specific structure of the second electrode 205 shown in FIG. 6A and FIG. 6E to FIG. 6G, it may be referred to previous description of the specific structure of the second electrode 205 shown in FIG. 5A and FIG. 5E to FIG. 5G, which will not be repeatedly described here again.

It should be noted that, in a case where the PN junction includes the second junction region close to the bottom surface of the top cell 201 and the bottom surface of the bottom cell 200, and the first junction region 301 perpendicular to the bottom surface of the top cell 201, the first electrode 204 and the second electrode 205 with different structures shown in FIG. 6A to FIG. 6G may be arbitrarily combined. For example, when the PN junction includes the second junction region close to the bottom surface of the top cell 201 and the bottom surface of the bottom cell 200, and the first junction region 301 perpendicular to the bottom surface of the top cell 201, the first electrode 204 penetrating the bottom cell 200 may be the first electrode 204 shown in FIG. 6C. The second electrode 205 penetrating the bottom cell 200 may be the second electrode 205 shown in FIG. 6E.

Figure 7A:
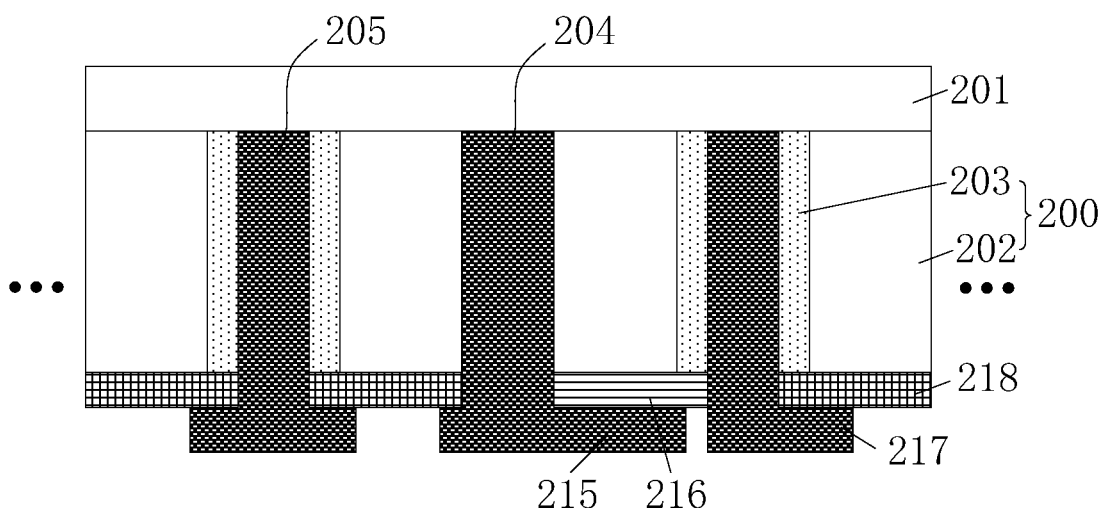
FIG. 7A is a schematic diagram of a first structure of a tandem solar cell including a first electrode auxiliary layer and a second electrode auxiliary layer according to an embodiment of the present disclosure.
Figure 7B:
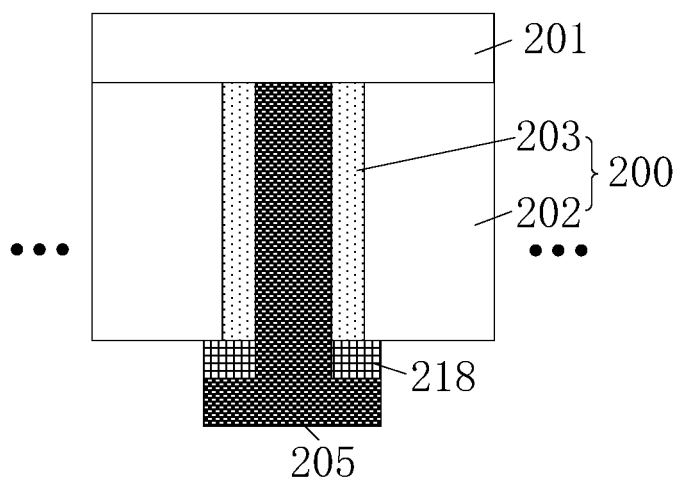
FIGS. 7B to 7D are schematic diagrams of alternative structures of a second electrode auxiliary layer in the structure shown in FIG. 7A.
Figure 7C:
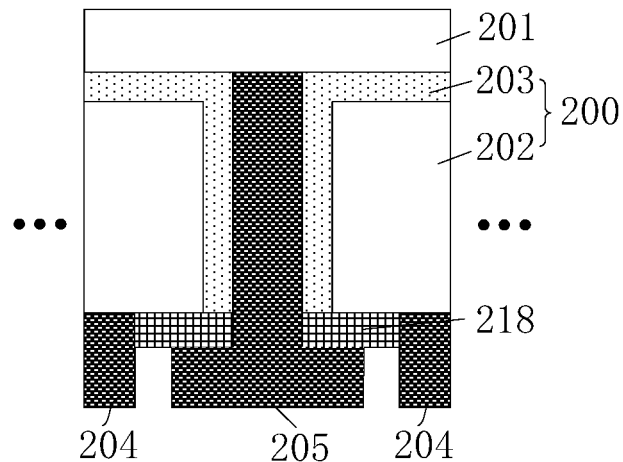
Figure 7D:
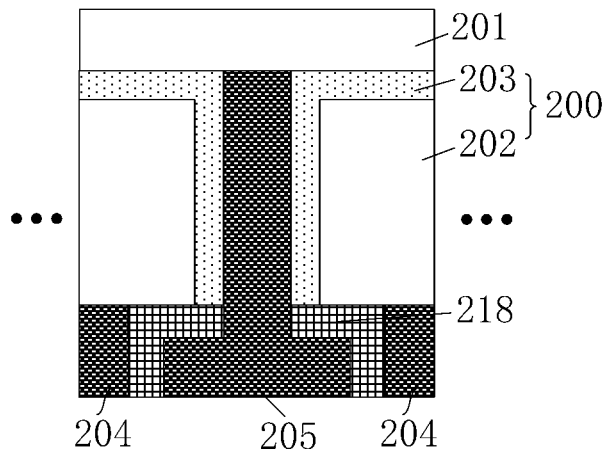

In a possible implementation, as shown in FIG. 7A, the bottom cell 200 includes a first junction region 301 perpendicular to the top cell 201, and a side away from the bottom of the top cell 201 not provided with a second junction region parallel to the bottom surface of the top cell 201. The first electrode 204 has a first outer edge part 215 extending out of the corresponding first electrode hole on a side of the first electrode away from the top cell 201. The tandem solar cell further includes a first electrode auxiliary layer 216 located between the first outer edge part 215 and the second doped part 203. And/or, the second electrode 205 has a second outer edge part 217 extending out of the corresponding second electrode hole on a side of the second electrode away from the top cell 201. The tandem solar cell further includes a second electrode auxiliary layer 218 located between the second outer edge part 217 and the first doped part 202. The first electrode auxiliary layer 216 and the second electrode auxiliary layer 218 have at least the electrical isolation function. It should be understood that the first electrode 204 and the second electrode 205 may extend out of the first electrode hole or the second electrode hole in the direction away from the top cell 201, respectively, and the first outer edge part 215 of the first electrode 204 and the second outer edge part 217 of the second electrode 205 may both extend in the direction parallel to the bottom surface of the bottom cell 200. The specifications and materials of the first outer edge part 215 and the second outer edge part 217 may be set according to actual application scenarios. Specifically, the first electrode 204 is an electrode for exporting the first-type carriers of the top cell 201 and the bottom cell 200. A majority carrier of the second doped part 203 is a second-type carrier. When the first electrode 204 has the first outer edge part 215 located in the corresponding first electrode hole away from the bottom surface of the top cell 201, the first electrode auxiliary layer 216 may separate the first outer edge part 215 from the second doped part 203, thus reducing probability of recombination of the first-type carriers with the second-type carriers.

Specifically, as shown in FIG. 7A, when the first electrode auxiliary layer 216 has the electrical isolation function, the existence of the first electrode auxiliary layer 216 may prevent the first outer edge part 215 from being electrically connected with the second doped part 203, thus preventing the PN junction from being short-circuited. The first electrode auxiliary layer 216 with the electrical isolation function may be made of an insulating material such as silicon dioxide and silicon nitride. Similarly, in the above case, beneficial effects of the second electrode auxiliary layer 218 may be referred to those of the first electrode auxiliary layer 216, which will not be repeatedly described here again. When the second electrode auxiliary layer 218 has the electrical isolation function, the material contained may be set with reference to the material of the first electrode auxiliary layer 216 described above.

Figure 7E:
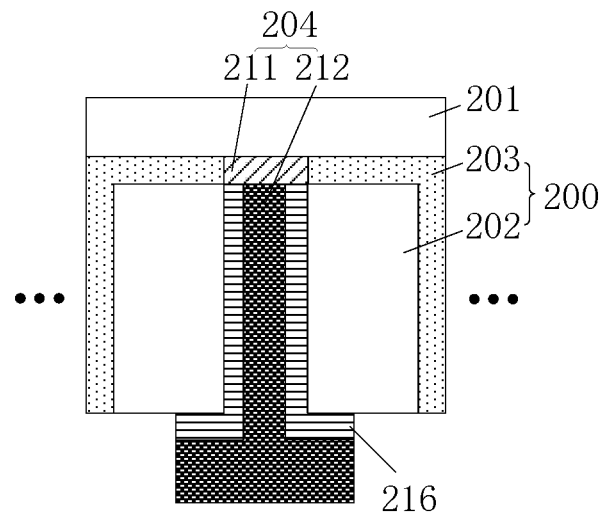
FIG. 7E is a schematic diagram of an alternative structure of the first electrode auxiliary layer in the structure shown in FIG. 7A.
Figure 7F:
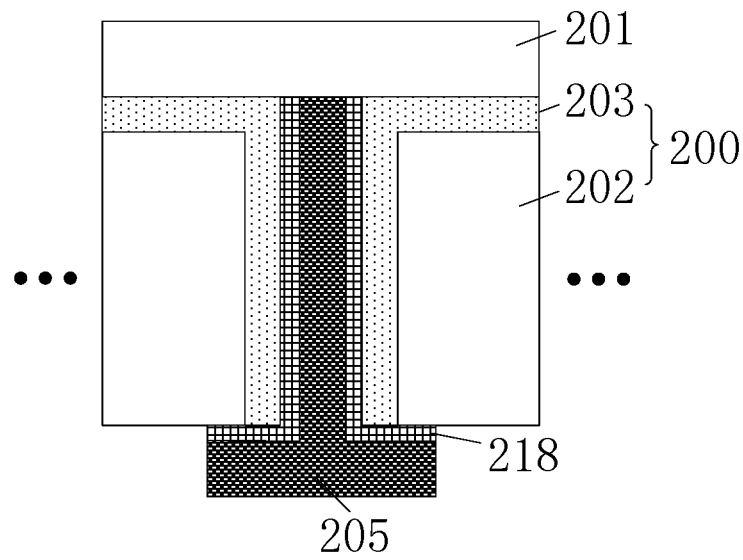
FIG. 7F is a schematic diagram of an alternative structure of a second electrode auxiliary layer in the structure shown in FIG. 7A.

In an alternative way, as shown in FIG. 7E and FIG. 7F, the first electrode auxiliary layer 216 extends into the first electrode hole. A part of the first electrode auxiliary layer 216 extending into the first electrode hole is formed between the first electrode 204 and the first doped part 202. The second electrode auxiliary layer 218 extends into the second electrode hole. A part of the second electrode auxiliary layer 218 extending into the second electrode hole is formed between the second electrode 205 and the second doped part 203. A part of the first electrode auxiliary layer 216 between the first electrode 204 and the first doped part 202 and a part of the second electrode auxiliary layer 218 between the second electrode 205 and the second doped part 203 have at least one of the lattice matching function, the energy-band matching function and the passivation function.

Specifically, as shown in FIG. 7E and FIG. 7F, when the first electrode auxiliary layer 216 has the lattice matching function, the existence of the first electrode auxiliary layer 216 may reduce lattice mismatch between the first electrode 204 and the first doped part 202, preventing a defect recombination center from being formed between the first electrode 204 and the first doped part 202, and further reducing probability of recombination of the first-type carriers with the second-type carriers at a contact between the first electrode 204 and the first doped part 202. The first electrode auxiliary layer 216 with the lattice matching function may be set according to lattice constants of materials of the first electrode 204 and the first doped part 202. Generally speaking, when the first electrode auxiliary layer 216 has the lattice matching function, a lattice constant of the first electrode auxiliary layer 216 is required to be between the lattice constants of the first electrode 204 and the first doped part 202. For example, when the first doped part 202 is made of Si and the first electrode 204 is made of Ge, the first electrode auxiliary layer 216 may be made of SixGe1−x (0<x<1).

As shown in FIG. 7E and FIG. 7F, when the first electrode auxiliary layer 216 has the energy-band matching function, the first electrode auxiliary layer 216 may also reduce an energy-level difference between the first electrode 204 and the first doped part 202, improving a conduction rate of the first-type carrier from the first doped part 202 into the first electrode 204, increasing utilization of light energy of the bottom cell 200, and finally improving the photoelectric conversion efficiency of the tandem solar cell. A material of the first electrode auxiliary layer 216 with the energy-band matching function may be set according to energy levels of materials of the first electrode 204 and the first doped part 202. Generally, when the first electrode auxiliary layer 216 has the energy-band matching function, an energy level of the material of the first electrode auxiliary layer 216 is required to be between energy levels of the first electrode 204 and the first doped part 202. For example, when the first doped part 202 is made of N-type Si and the first electrode 204 is made of metal material, the first electrode auxiliary layer 216 may be made of i-a-Si: H/BZO or may be made of i-a-Si: H/n+-a-Si: H.

As shown in FIG. 7E and FIG. 7F, when the first electrode auxiliary layer 216 has the passivation function, the first electrode auxiliary layer 216 may reduce a surface state density of the first electrode 204 and the first doped part 202, and reduce a rate of defect recombination of the first-type carriers generated in the bottom cell 200 with the second-type carriers at a contact position between the first electrode 204 and the first doped part 202. The first electrode auxiliary layer 216 with the passivation function may be a silicon nitride layer, an amorphous silicon layer, a silicon dioxide layer or an aluminum oxide layer. Specifically, the silicon nitride layer and the amorphous silicon layer may be a silicon nitride layer and an amorphous silicon layer formed by plasma enhanced chemical vapor deposition respectively.

The silicon dioxide layer may be a thermally oxidized silicon dioxide layer. The aluminum oxide layer may be an aluminum oxide layer formed by atomic layer deposition. Certainly, the first electrode auxiliary layer 216 may also be other film layers with passivation function.

Similarly, in the above case, beneficial effects of the second electrode auxiliary layer 218 may be referred to those of the first electrode auxiliary layer 216, which will not be repeatedly described here again. When the second electrode auxiliary layer 218 has the lattice matching function, the energy-band matching function and passivation function respectively, the material contained may be set with reference to the material of the first electrode auxiliary layer 216 described above.

It should be noted that since the part of the first electrode auxiliary layer 216 extending into the first electrode hole is located between the first electrode 204 and the first doped part 202, and the part of the second electrode auxiliary layer 218 extending into the second electrode hole is located between the second electrode 205 and the second doped part 203, a specific specification of the first electrode auxiliary layer 216 in the first electrode hole may be set according to contact situations between the first electrode 204 and the first doped part 202. Meanwhile, a specific specification of the second electrode auxiliary layer 218 in the second electrode hole may be set according to contact situations between the second electrode 205 and the second doped part 203.

Figure 7G:
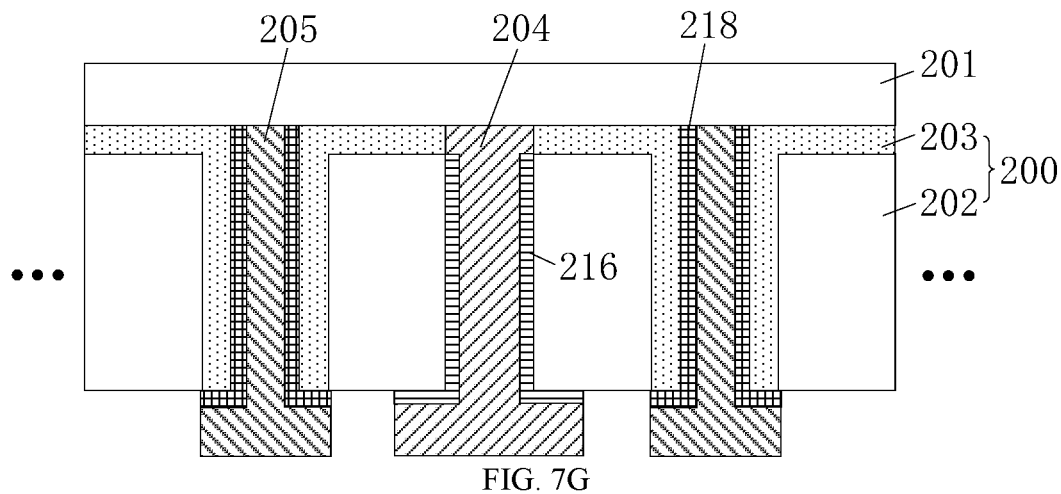
FIG. 7G is a schematic diagram of a second structure of a tandem solar cell including a first electrode auxiliary layer and a second electrode auxiliary layer according to an embodiment of the present disclosure.

For example, as shown in FIG. 7G, the PN junction includes the second junction region close to the bottom surface of the top cell 201 and a first junction region 301 perpendicular to the bottom surface of the top cell 201, and an end of the first electrode 204 close to the top cell 201 may be in contact with the second doped part 203. At this time, the first electrode auxiliary layer 216 may extend inward in a bottom-up direction from a hole of the first electrode hole away from the top cell 201 to a position where the first electrode 204 is in contact with the second doped part 203. Meanwhile, a respective part of the second electrode 205 located in the second electrode hole is in contact with the second doped part 203, so the second electrode auxiliary layer 218 may cover a surface of the second doped part 203 away from the first doped part 202.

Figure 7H:
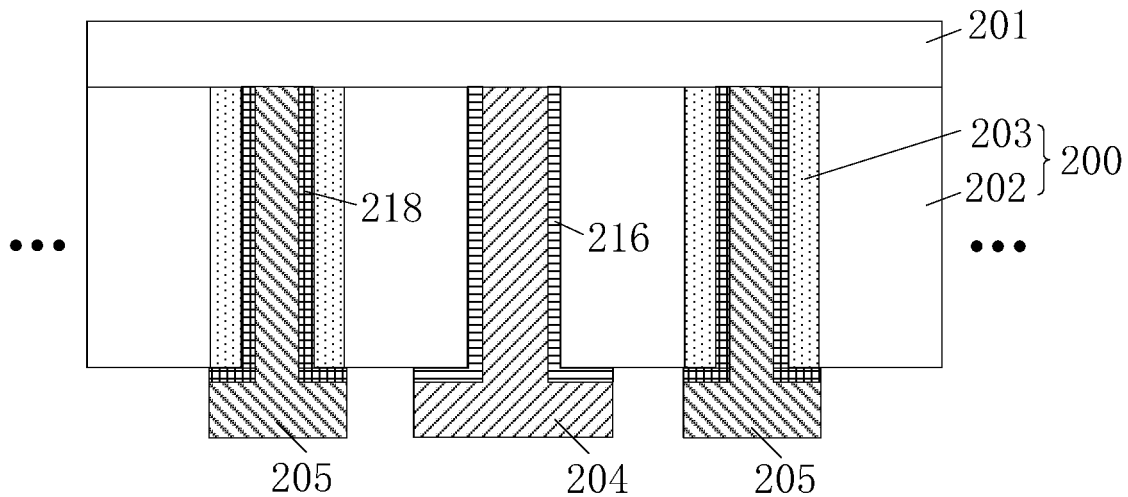
FIG. 7H is a schematic diagram of a third structure of a tandem solar cell including a first electrode auxiliary layer and a second electrode auxiliary layer according to an embodiment of the present disclosure.

For example, as shown in FIG. 7H, when the PN junction only includes the first junction region 301 perpendicular to the bottom surface of the top cell 201, a respective part of the first electrode 204 located in the first electrode hole is in contact with the first doped part 202, so the first electrode auxiliary layer 216 may cover an inner wall of the first electrode hole. Meanwhile, the respective part of the second electrode 205 located in the second electrode hole is in contact with the second doped part 203, so the second electrode auxiliary layer 218 may cover a surface of the second doped part 203 away from the first doped part 202.

In an alternative way, as shown in FIG. 7A to FIG. 7D, when the tandem solar cell includes a first outer edge part 215 and a second outer edge part 217, and the first outer edge part 215 and the second outer edge part 217 are made of metal materials, the first electrode auxiliary layer 216 and/or the second electrode auxiliary layer 218 are configured to prevent the first outer edge part 215 and the second outer edge part 217 from being in contact with each other. It should be understood that when materials contained in both the first outer edge part 215 and the second outer edge part 217 are metal materials, the first outer edge part 215 and the second outer edge part 217 both have ability to conduct the first-type carriers and the second-type carriers. On this basis, when the first electrode auxiliary layer 216 further includes a part between the first outer edge part 215 and the second outer edge part 217, and the first electrode auxiliary layer 216 has insulation property, the existence of the first electrode auxiliary layer 216 may prevent the first outer edge part 215 from be in contact with the second outer edge part 217, preventing two opposite electrodes from being electrically connected with each other, and improving the operation stability of the tandem solar cell. When a structure between the first outer edge part 215 and the second outer edge part 217 is the second electrode auxiliary layer 218, and the second electrode auxiliary layer 218 has an insulation property, the existence of the second electrode auxiliary layer 218 may also prevent the first outer edge part 215 from being in contact with the second outer edge part 217, preventing the two opposite electrodes from being electrically connected with each other.

Specifically, the metal materials contained in the first outer edge part 215 and the second outer edge part 217 may be gold, silver, aluminum, copper or the like. The first electrode auxiliary layer 216 and the second electrode auxiliary layer 218 may be passivation layers with insulating properties. Such as silicon dioxide, silicon nitride, etc.

In a possible implementation, as shown in FIG. 8A to FIG. 8D, the tandem solar cell further includes at least two auxiliary electrodes 219. At least one of the two auxiliary electrodes 219 covers a surface of a corresponding first electrode 204 facing the top cell 201. At least one of the two auxiliary electrodes 219 covers a surface of a corresponding second electrode 205 facing the top cell 201. A corresponding auxiliary electrode 219 of each first electrode 204 is made of a metal material and/or a first-type carrier conducting material. And/or, a corresponding auxiliary electrode 219 of each second electrode 205 is made of a metal material and/or a second-type carrier conducting material. It should be understood that the first electrode 204 and the second electrode 205 are respectively formed in the first electrode hole and the second electrode hole penetrating through the bottom cell 200, so effective contact areas of the first electrode 204 and the second electrode 205 with the top cell 201 are respectively affected by radial cross-sectional areas of the first electrode hole and the second electrode hole. When at least one auxiliary electrode 219 is respectively covered on surfaces of the first electrode 204 and the second electrode 205 facing the top cell 201, the existence of the auxiliary electrode 219 may increase the effective contact areas of the first electrode 204 and the second electrode 205 with the top cell 201. In addition, conductivity of the metal material, the first-type carrier conducting material and the second-type carrier conducting material to carriers is much higher than that of a semiconductor material, so the existence of the auxiliary electrode 219 may enhance ability of the first electrode 204 and the second electrode 205 to collect corresponding types of carriers, thus improving the photoelectric conversion efficiency of the tandem solar cell.

Specifically, the auxiliary electrodes 219 covering the first electrode 204 and the second electrode 205 may be made of a same material or different materials. Respective auxiliary electrodes 219 covering the first electrode 204 or the second electrode 205 may be made of a same material or different materials. In addition, a specific structure and shape of the auxiliary electrode 219 may be set according to the actual situation, as long as it is ensured that an effective contact area between the first electrode 204 as well as the second electrode 205 and the top cell 201 may be increased.

In one example, as shown in FIG. 8A to FIG. 8D, when the auxiliary electrodes 219 covering the first electrode 204 and the second electrode 205 are made of the same material, the auxiliary electrodes 219 are all made of metal materials. At this time, in order to prevent the first electrode 204 from being electrically connected with an adjacent second electrode 205, the auxiliary electrode 219 located above the first electrode 204 and the auxiliary electrode 219 located above the second electrode 205 are not in contact with each other.

In another example, as shown in FIG. 8A to FIG. 8D, when the auxiliary electrodes 219 covering the first electrode 204 and the second electrode 205 are made of different materials, the auxiliary electrode 219 covering the first electrode 204 may be made of a metal material, and the auxiliary electrode 219 located on the second electrode 205 may be made of a second-type carrier conducting material.

Alternatively, as shown in FIG. 8A to FIG. 8D, the auxiliary electrode 219 covering the first electrode 204 may be made of the first-type carrier conducting material, and the auxiliary electrode 219 located on the second electrode 205 may be made of the metal material.

Alternatively, as shown in FIG. 8A to FIG. 8D, the auxiliary electrode 219 covering the first electrode 204 may be made of the first-type carrier conducting material, and the auxiliary electrode 219 located on the second electrode 205 may be made of the second-type carrier conducting material.

It is noted that as shown in FIG. 8A to FIG. 8D, when the auxiliary electrodes 219 covering the first electrode 204 and the second electrode 205 are made of different materials, in order to increase effective contact area between the auxiliary electrode 219 and the top cell 201, the auxiliary electrodes 219 located on the first electrode 204 and the second electrode 205 may be brought into contact.

Types of the metal material, the first-type carrier conducting material and the second-type carrier conducting materials contained in the auxiliary electrode 219 may be set by referring to types of the metal material, the first-type carrier conducting material and the second-type carrier conducting material contained in the first electrode 204 and/or the second electrode 205, which will not be repeatedly described here again.

Figure 8A:
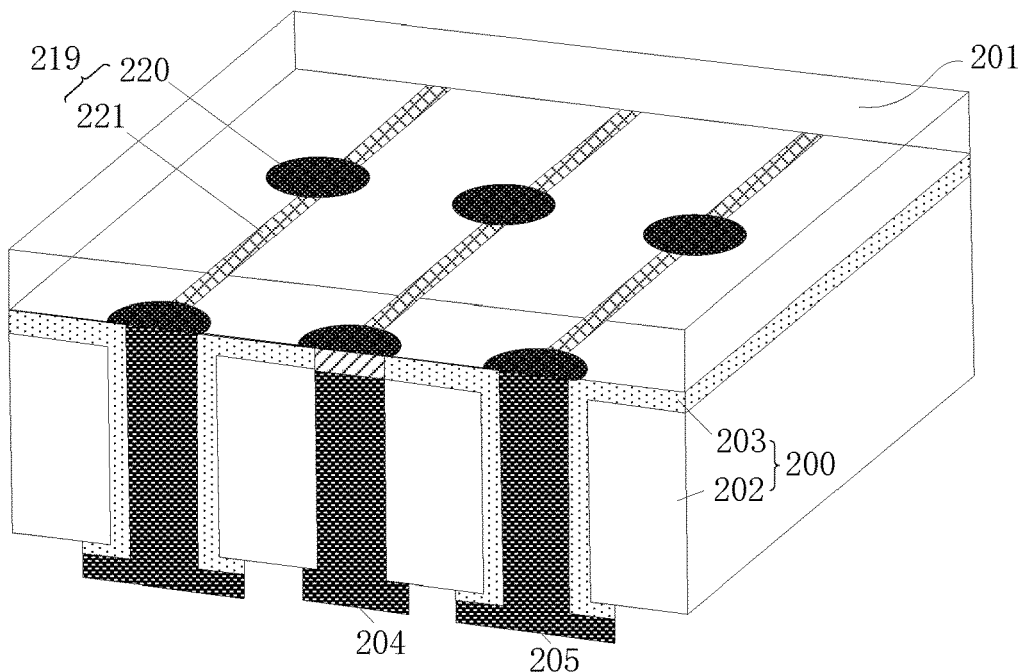
FIG. 8A is a schematic structural diagram of a tandem solar cell including an auxiliary electrode according to an embodiment of the present disclosure.
Figure 8B:
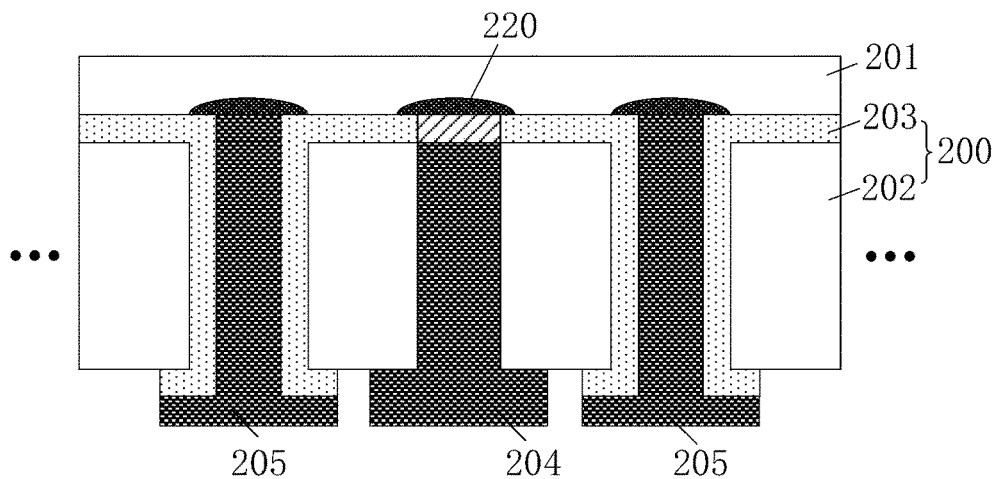
FIG. 8B is a longitudinal sectional view of the structure shown in FIG. 8A.

In an alternative way, as shown in FIG. 8A and FIG. 8B, each auxiliary electrode 219 includes a plurality of main electrodes 220 and at least one fine grid line 221. The plurality of main electrodes 220 are electrically connected by a fine grid line 221. The main electrode 220 is located at a part of a corresponding first electrode 204 or second electrode 205 contacting with the top cell 201. It should be understood that the fine grid line 221 included in each auxiliary electrode 219 may facilitate collecting of the first-type carrier or the second-type carrier. Furthermore, the plurality of main electrodes 220 included in each auxiliary electrode 219 is covered at a part of the corresponding first electrode 204 or second electrode 205 contacting with the top cell 201, thus facilitating the first electrode 204 or second electrode 205 to collect the first-type carrier or the second-type carrier in the top cell 201, reducing probability of recombination of the two types of carriers in the top cell 201 at an interface between the top cell 201 and the bottom cell 200, and improving utilization of light energy of the tandem solar cell.

Specifically, as shown in FIG. 8A and FIG. 8B, a shape of the main electrode 220 may be rectangular, square, polygonal, elliptical or in other shapes, which is not specifically limited here, as long as a contact area of the main electrode 220 with the top cell 201 is larger than radial cross-sectional areas of the first electrode 204 and the second electrode 205, and the first electrode 204 and the second electrode 205 may be facilitated to collect a corresponding type of carriers. In addition, arrangement of respective auxiliary electrodes 219 and arrangement of the main electrodes 220 included in each auxiliary electrode 219 may be set according to arrangement of the first electrode 204 and the second electrode 205. An extending direction of the fine grid line 221 included in each auxiliary electrode 219 may be set according to a positional relationship between adjacent first electrodes 204 or adjacent second electrodes 205.

Illustratively, as shown in FIG. 8A and FIG. 8B, the main electrode 220 may be in a hemispherical structure. A surface of the main electrode 220 contacting with the first electrode 204 or the second electrode 205 is a circular plane, and a surface of the main electrode 220 contacting with the top cell 201 is an arc curved surface. When the first electrode 204 and the second electrode 205 are arranged in a matrix, the respective main electrodes 220 included in each auxiliary electrode 219 may be arranged in a matrix. Furthermore, a geometric center of a bottom surface of a respective main electrode 220 included in each auxiliary electrode 219 may coincide with an axis of the fine grid line 221. In addition, in order to increase a number of electrons and holes respectively collected by the first electrode 204 and the second electrode 205, a number of main electrodes 220 included in each auxiliary electrode 219 may be appropriately increased. A main electrode 220 added in each auxiliary electrode 219 is electrically connected to the fine grid line 221 and distributed along an axial direction of the fine grid line 221.

The fine grid line 221 may be made of a metal material. The main electrode 220 on the first electrode 204 may be made of a metal material and/or a first-type carrier conducting material. The main electrode 220 on the second electrode 205 may be made of a metal material and/or a second-type carrier conducting material.

Figure 8C:
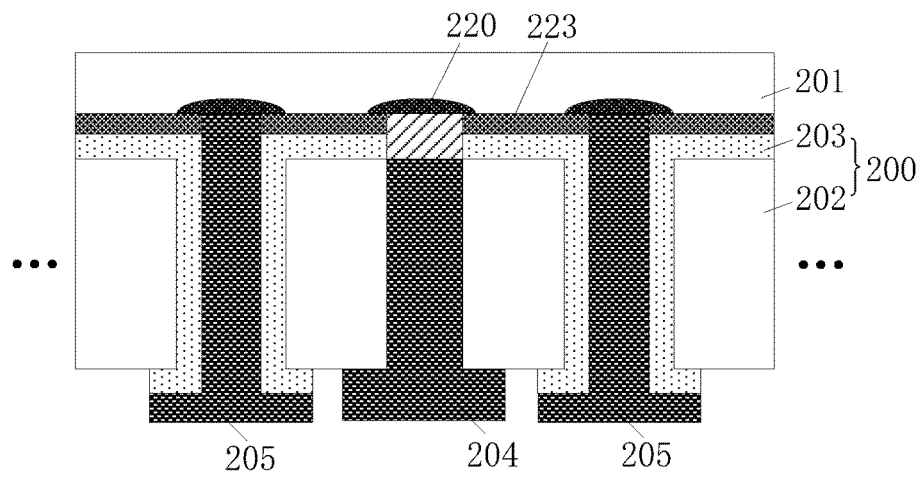
FIGS. 8C and 8D are schematic diagrams of a structure of a tandem solar cell including a diffusion barrier layer and an auxiliary electrode.
Figure 8D:
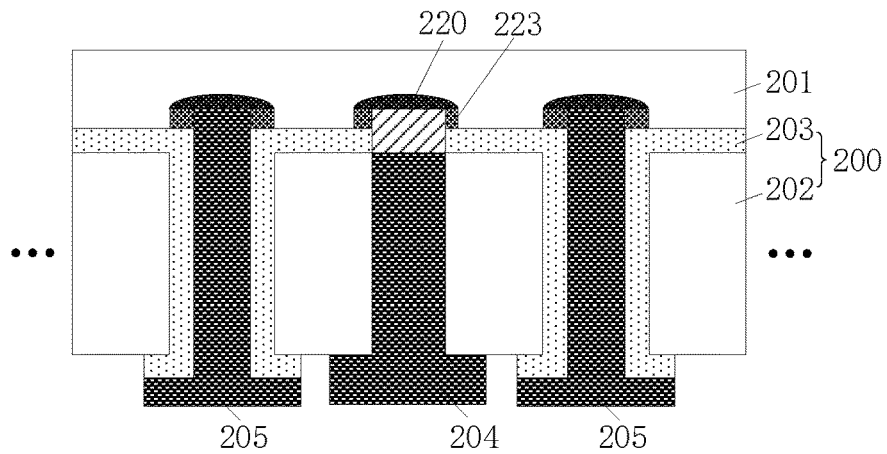

It is noted that as shown in FIG. 8C and FIG. 8D, when the tandem solar cell described above further includes the auxiliary electrode 219, a diffusion barrier layer 223 may be provided between the auxiliary electrode 219 and the first electrode 204, and between the auxiliary electrode 219 and the second electrode 205. During operation of the tandem solar cell, the existence of the diffusion barrier layer 223 may prevent active ions in the auxiliary electrode 219 from diffusing into the first doped part 202 and/or the second doped part 203, which will affect operation performance of the tandem solar cell. Specifically, as shown in FIG. 8C, the diffusion barrier layer 223 may be disposed on a surface of the bottom cell 200 close to the auxiliary electrode 219 in its entirety. Furthermore, the first electrode 204 and the second electrode 205 penetrate through the diffusion barrier layer 223. Alternatively, as shown in FIG. 8D, the first electrode 204 and the second electrode 205 extend out of the first electrode hole and the second electrode hole, respectively, along a direction close to the top cell 201. The diffusion barrier layer 223 surrounds an outer periphery of a part of the first electrode 204 extending out of the first electrode hole, and the diffusion barrier layer 223 surrounds an outer periphery of a part of the second electrode 205 extending out of the second electrode hole. The diffusion barrier layer 223 may be made of tantalum nitride or other materials that meet requirements.

In a possible implementation, as shown in FIG. 9A to FIG. 9E, the tandem solar cell further includes a first auxiliary layer 222. Longitudinal conductive ability of the first auxiliary layer 222 is greater than lateral conductive ability thereof. The first auxiliary layer 222 is formed on a surface of the bottom cell 200 close to the top cell 201. A material contained in the first auxiliary layer 222 has at least one of the passivation function, the optical adjustment function, the lattice matching function and the energy-band matching function.

Figure 9A:
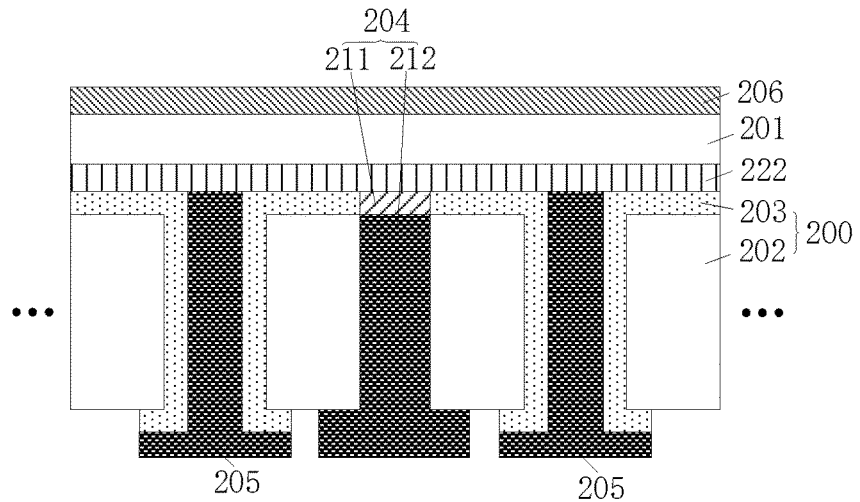
FIG. 9A is a schematic diagram of a structure of a tandem solar cell including a first auxiliary layer and a second auxiliary layer.

Specifically, as shown in FIG. 9A, the longitudinal conductive ability of the first auxiliary layer 222 is greater than the lateral conductive ability. It should be understood that the first auxiliary layer 222 is located between the bottom cell 200 and the top cell 201, and the first electrode 204 and the second electrode 205 penetrate through the bottom cell 200, so that surfaces of the first electrode 204 and the second electrode 205 close to the top cell 201 may be in contact with the first auxiliary layer 222. On this basis, if the first auxiliary layer 222 has conductive ability and the longitudinal conductive ability of the first auxiliary layer 222 is greater than the lateral conductive ability, it means that a longitudinal conduction rate of the first-type carrier and the second-type carrier in the first auxiliary layer 222 is greater than a lateral conduction rate thereof, which may prevent the first electrode 204 and the second electrode 205 from being short-circuited through electrical connection of the first auxiliary layer 222 and improve the operation stability of the tandem solar cell. In this case, the first auxiliary layer 222 may be a tunnel junction layer. At this time, the first auxiliary layer 222 may generate a moving path of carriers, and facilitate conducting of the carriers between layers. For example, the first auxiliary layer 222 may be made of intrinsic hydrogenated amorphous silicon. Certainly, the first auxiliary layer 222 may also be other auxiliary layers with conductive ability greater than lateral conductive ability.

As for the first auxiliary layer 222 with the passivation function, the lattice matching function and the energy-band matching function, the material of the first auxiliary layer 222 may be set by referring to the material of the first electrode auxiliary layer 216 with the passivation function, the lattice matching function and the energy-band matching function, which will not be repeatedly described here again. When the first auxiliary layer 222 has an optical adjustment function, the first auxiliary layer 222 may be made of silicon oxide or nitride, or may be made of aluminum oxide or nitride. For example, the first auxiliary layer 222 may be made of $SiO_y$, $Al2O3$, $SiN_z$, $SiON$, $SiCN$, etc. A specific structure and a layer thickness of the first auxiliary layer 222 may be set according to actual application scenarios, as long as it may be applied to the tandem solar cell according to an embodiment of the present disclosure.

Figure 9B:
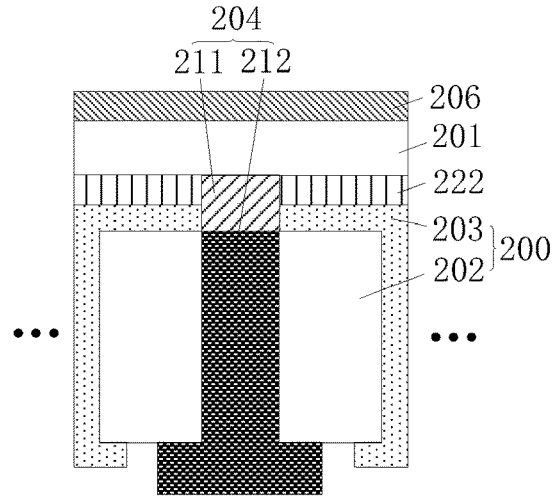
FIGS. 9B and 9C are schematic diagrams of a structure of a first electrode penetrating through the first auxiliary layer.
Figure 9C:
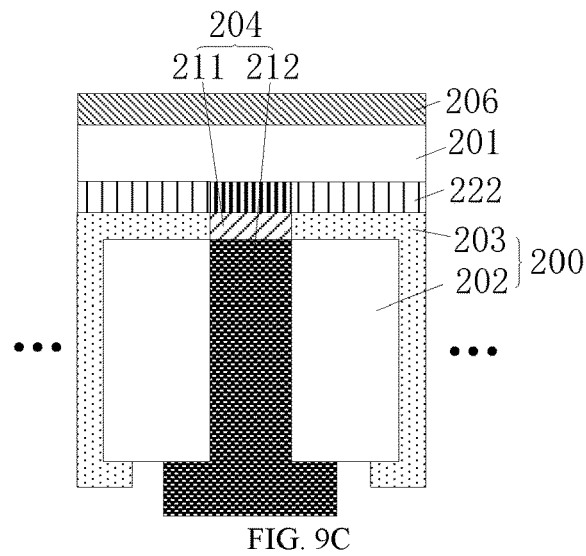
Figure 9D:
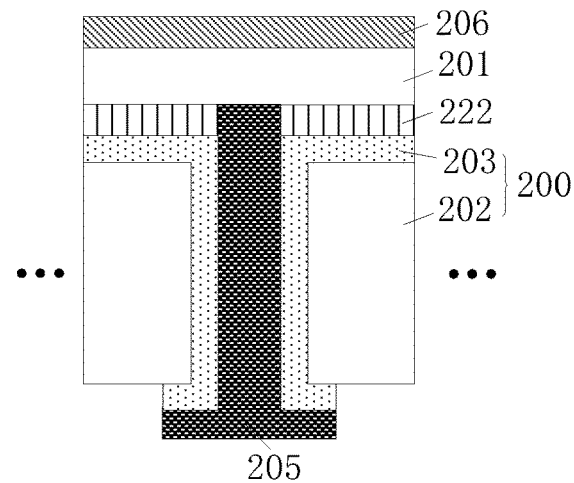
FIGS. 9D and 9E are schematic diagrams of structure of a second electrode penetrating through the first auxiliary layer.
Figure 9E:
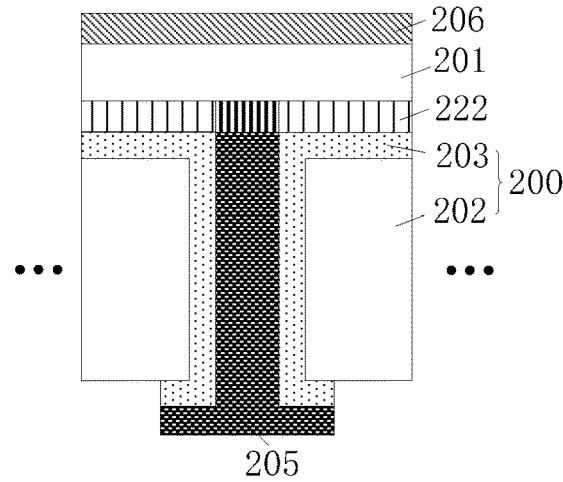

Illustratively, as shown in FIG. 9A, FIG. 9C, and FIG. 9E, the first auxiliary layer 222 may be a film layer disposed between the bottom cell 200 and the top cell 201 in its entity. At this time, respective areas of the first auxiliary layer 222 may be made of a same material or different materials. For example, as shown in FIG. 9C, a part of the first auxiliary layer 222 located on the first electrode 204 may be made of different materials from other parts of the first auxiliary layer 222. Specifically, the part of the first auxiliary layer 222 located on the first electrode 204 may be made of the first-type carrier conducting material. As shown in FIG. 9D, the part of the first auxiliary layer located on the second electrode 205 may be made of different materials from other parts of the first auxiliary layer 222. Specifically, the part of the first auxiliary layer 222 located on the second electrode 205 may be made of the second-type carrier conducting material.

It is worth noted that, regardless of which or several of the passivation function, the optical adjustment function, the lattice matching function and the energy-band matching function the first auxiliary layer 222 have, operation performance of the tandem solar cell may be improved by arranging the first auxiliary layer 222 between the bottom cell 200 and the top cell 201. Specifically, when the first auxiliary layer 222 has the passivation function and/or the lattice matching function, the first auxiliary layer 222 may reduce recombination probability of the two types of carriers at the interface between the top cell 201 and the bottom cell 200. When the first auxiliary layer 222 has the optical adjustment function, the first auxiliary layer 222 may have good light trapping effect, so that more light may be transmitted into the bottom cell 200. When the first auxiliary layer 222 has the energy-band matching function, the first auxiliary layer 222 may reduce energy level difference between the top cell 201 and the first electrode 204 as well as the second electrode 205, respectively, and improve a conduction rate of the two types of carriers from the top cell 201 to the first electrode 204 or the second electrode 205, so as to facilitate the first electrode 204 and the second electrode 205 to collect corresponding carriers.

In an alternative way, as shown in FIG. 9B and FIG. 9D, at least one first electrode 204 or at least one second electrode 205 penetrates through the first auxiliary layer 222. Certainly, at least one first electrode 204 and at least one second electrode 205 may penetrate through the first auxiliary layer 222 at the same time. At this time, the first electrode 204 and/or the second electrode 205 penetrating through the first auxiliary layer 222 may be in directly contact with the backlight surface of the top cell 201, which facilitates the first electrode 204 and/or the second electrode 205 to collect the corresponding carriers in the top cell 201 and improves the operation performance of the tandem solar cell.

In a possible implementation, as shown in FIG. 9A, the tandem solar cell may further include a second auxiliary layer 206. The second auxiliary layer 206 is located on a surface of the top cell 201 away from the bottom cell 200. The second auxiliary layer 206 has anti-reflection function or passivation function. A layer thickness of the second auxiliary layer 206 may be set according to the actual application scenarios, which is not specifically limited herein. For example, the second auxiliary layer 206 with the anti-reflection function may be made of silicon nitride. The second auxiliary layer 206 with the passivation function may be made of amorphous silicon or the like.

In description of above embodiments, specific features, structures, materials or characteristics may be combined in any one or more of embodiments or examples in a suitable manner.

The above is only specific embodiments of the present disclosure, but a protection scope of the present disclosure is not limited to this, and any change or substitution which occurs to any person familiar with this technical field within the technical scope disclosed by the present disclosure should be encompassed within the protection scope of the present disclosure. Therefore, protection scope of the present disclosure shall be subject to a protection scope of the claims.

The invention claimed is:

1. A tandem solar cell, comprising: a bottom cell and a top cell located above the bottom cell, wherein the bottom cell comprises a first doped part and a second doped part, the first doped part and the second doped part form at least one PN junction, a majority carrier of the first doped part is a first-type carrier, and a majority carrier of the second doped part is a second-type carrier;

the bottom cell has a first electrode hole and a second electrode hole penetrating through the bottom cell, a first electrode is at least partially arranged in the first electrode hole and a second electrode is at least partially arranged in the second electrode hole; and the first electrode is in contact with the first doped part and a bottom surface of the top cell, and is configured for exporting first-type carriers of the bottom cell and the top cell, and the second electrode is in contact with the second doped part and the bottom surface of the top cell, and is configured for exporting second-type carriers of the bottom cell and the top cell;

wherein the tandem solar cell further comprises at least two auxiliary electrodes, at least one of the auxiliary electrodes is covered on a surface of a corresponding first electrode facing the top cell, and at least one of the auxiliary electrodes is covered on a surface of a corresponding second electrode facing the top cell; and the auxiliary electrode corresponding to the first electrode is made of at least one of a metal material and a first-type carrier conducting material; and/or, the auxiliary electrode corresponding to the second electrode is made of at least one of the metal material and a second-type carrier conducting material;

wherein the tandem solar cell further comprises a first auxiliary layer, the first auxiliary layer is formed on a surface of the bottom cell close to the top cell: longitudinal conductive ability of the first auxiliary layer is greater than lateral conductive ability thereof;

and a material contained in the first auxiliary layer has at least one of a passivation function, an optical adjustment function, a lattice matching function and an energy-band matching function.

2. The tandem solar cell according to claim 1, wherein each of the at least one PN junction comprises:
a first junction region perpendicular to the top cell; and/or,
a second junction region parallel to a bottom surface of the top cell.

3. The tandem solar cell according to claim 2, wherein the PN junction comprises a second junction region parallel to the bottom surface of the top cell;
a part of the first electrode contacting with the second doped part is set as a third conducting part, and the third conducting part is made of the first-type carrier conducting material; and
a part of the second electrode contacting with the first doped part is set as a fourth conducting part, and the fourth conducting part is made of the second-type carrier conducting material.

4. The tandem solar cell according to claim 1, wherein the PN junction comprises a first junction region perpendicular to the bottom surface of the top cell, and the first electrode is made of at least one of the metal material and the first-type carrier conducting material; and/or, the second electrode is made of at least one of the metal material and the second-type carrier conducting material.

5. The tandem solar cell according to claim 4, wherein the first electrode comprises a first conducting part and a first metal part distributed in a direction away from the top cell; and at least part of the first conducting part is located in a corresponding first electrode hole, and the first conducting part is made of the first-type carrier conducting material; and
the second electrode comprises a second conducting part and a second metal part distributed in the direction away from the top cell; and at least part of the second conducting part is located in a corresponding second electrode hole, and the second conducting part is made of the second-type carrier conducting material.

6. The tandem solar cell according to claim 5, wherein at least part of the first metal part is located in the corresponding first electrode hole, and at least part of the second metal part is located in the corresponding second electrode hole; or, the first metal part is located outside the first electrode hole, and the second metal part is located outside the second electrode hole.

7. The tandem solar cell according to claim 1, wherein each of the at least two auxiliary electrodes comprises a plurality of main electrodes and at least one fine grid line, the plurality of main electrodes are electrically connected by one fine grid line; and each of the plurality of main electrodes is located at a part of the corresponding first electrode or second electrode contacting with the top cell.

8. The tandem solar cell according to claim 1, wherein at least one first electrode and/or at least one second electrode penetrates through the first auxiliary layer.

9. A tandem solar cell comprising:

a bottom cell and a top cell located above the bottom cell, wherein the bottom cell comprises a first doped part and a second doped part, the first doped part and the second doped part form at least one PN junction, a majority carrier of the first doped part is a first-type carrier, and a majority carrier of the second doped part is a second-type carrier;

the bottom cell has a first electrode hole and a second electrode hole penetrating through the bottom cell, a first electrode is at least partially arranged in the first electrode hole and a second electrode is at least partially arranged in the second electrode hole; and the first electrode is in contact with the first doped part and a bottom surface of the top cell, and is configured for exporting first-type carriers of the bottom cell and the top cell, and the second electrode is in contact with the second doped part and the bottom surface of the top cell, and is configured for exporting second-type carriers of the bottom cell and the top cell;

wherein the bottom cell comprises a first junction region perpendicular to the top cell, and a side away from the bottom surface of the top cell is not provided with a second junction region parallel to the bottom surface of the top cell;

the first electrode has a first outer edge part extending out of a corresponding first electrode hole on a side of the first electrode away from the top cell, and the tandem solar cell further comprises a first electrode auxiliary layer located between the first outer edge part and the second doped part; and the second electrode has a second outer edge part extending out of a corresponding second electrode hole on a side of the second electrode away from the top cell, and the tandem solar cell further comprises a second electrode auxiliary layer located between the second outer edge part and the first doped part; and the first electrode auxiliary layer and the second electrode auxiliary layer at least have an electrical isolation function.

10. The tandem solar cell according to claim 9, wherein the first electrode auxiliary layer extends into the first electrode hole, and a part of the first electrode auxiliary layer extending into the first electrode hole is formed between the first electrode and the first doped part;

the second electrode auxiliary layer extends into the second electrode hole, and a part of the second electrode auxiliary layer extending into the second electrode hole is formed between the second electrode and the second doped part; and a part of the first electrode auxiliary layer between the first electrode and the first doped part and a part of the second electrode auxiliary layer between the second electrode and the second doped part have at least one of a lattice matching function, an energy-band matching function and a passivation function.

11. The tandem solar cell according to claim 9, wherein the first outer edge part and the second outer edge part are made of metal materials; and the first electrode auxiliary layer and the second electrode auxiliary layer are used for avoiding contact between the first outer edge part and the second outer edge part.

* * * * *